United States Patent
Cabral, Jr. et al.

(10) Patent No.: US 6,982,230 B2
(45) Date of Patent: Jan. 3, 2006

(54) DEPOSITION OF HAFNIUM OXIDE AND/OR ZIRCONIUM OXIDE AND FABRICATION OF PASSIVATED ELECTRONIC STRUCTURES

(75) Inventors: Cyril Cabral, Jr., Ossining, NY (US); Alessandro C. Callegari, Yorktown Heights, NY (US); Michael A. Gribelyuk, Poughquag, NY (US); Paul C. Jamison, Hopewell Junction, NY (US); Dianne L. Lacey, Mahopac, NY (US); Fenton R. McFeely, Ossining, NY (US); Vijay Narayanan, New York, NY (US); Deborah A. Neumayer, Danbury, CT (US); Pushkar Ranade, Hillsboro, OR (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/291,334

(22) Filed: Nov. 8, 2002

(65) Prior Publication Data
US 2004/0092073 A1    May 13, 2004

(51) Int. Cl.
*H01L 21/31* (2006.01)

(52) U.S. Cl. .................. 438/778; 438/785; 438/198; 438/199; 438/238

(58) Field of Classification Search ............... 438/785, 438/773–5, 778, 198, 199, 238
See application file for complete search history.

(56) References Cited

U.S. PATENT DOCUMENTS

| 6,014,310 | A   | 1/2000  | Bronner et al. |
| 6,060,755 | A   | 5/2000  | Ma et al. |
| 6,087,231 | A   | 7/2000  | Xiang et al. |
| 6,291,366 | B1  | 9/2001  | Sano et al. |
| 6,297,539 | B1  | 10/2001 | Ma et al. |
| 6,387,761 | B1  | 5/2002  | Shih et al. |
| 6,413,386 | B1  | 7/2002  | Callegari et al. |
| 6,444,264 | B2 * | 9/2002 | Hintermaier et al. .. 427/255.32 |
| 6,486,080 | B2 * | 11/2002 | Chooi et al. ................ 438/785 |

(Continued)

OTHER PUBLICATIONS

Smith et al., Chemical Vapor Deposition of the Oxides of Titanium, Zirconium and Hafnium for Use as High-K Materials in Microelectronic Device, Adv. Mater. Opt Electron., vol. 10, pp. 105-114, Jun. 2000.*

(Continued)

*Primary Examiner*—George Fourson
*Assistant Examiner*—Thanh V. Pham
(74) *Attorney, Agent, or Firm*—Scully, Scott, Murphy & Presser; Robert M. Trepp, Esq.

(57) ABSTRACT

A method of fabricating hafnium oxide and/or zirconium oxide films is provided. The methods include providing a mixture of Hf and/or Zr alkoxide dissolved, emulsified or suspended in a liquid; vaporizing at least the alkoxide and depositing the vaporized component at a temperature of greater than 400° C. The resultant film is dense, microcrystalline and is capable of self-passivation when treated in a hydrogen plasma or forming gas anneal.

14 Claims, 18 Drawing Sheets

U.S. PATENT DOCUMENTS

| | | |
|---|---|---|
| 2001/0019901 A1 | 9/2001 | Sano et al. |
| 2001/0034106 A1 | 10/2001 | Moise et al. |
| 2002/0019109 A1 | 2/2002 | Iizuka |
| 2002/0072223 A1 | 6/2002 | Gilbert et al. |

OTHER PUBLICATIONS

Robert M. Wallace, et al., "Identifying the Most Promising High-k Gate Dielectrics", Semiconductor International, Jul. 2001, pp. 227236.

Abstract No. 7339529 from Inspec Database; "Characterisation of ALCVD A1203-Zr02 nanolaminates, link between electrical and structural properties", Journal of Non-Crystalline Solids, vol. 303, No. 1, May 2002.

Abstract No. 7124598 from Inspec Database, "Physical and electrical characaterization of Hafnium oxide and Hafnium silicate sputtered films", Journal of Applied Physics, vol. 90, No. 12, Dec. 15, 2001.

* cited by examiner

DEPOSITION OF HAFNIUM OXIDE AND/OR ZIRCONIUM OXIDE AND FABRICATION OF PASSIVATED ELECTRONIC STRUCTURES

FIELD OF THE INVENTION

The present invention relates to electronic devices, and more particular to a method of fabricating passivated electronic devices that contain hafnium oxide and/or zirconium oxide deposited by chemical vapor deposition.

BACKGROUND OF THE INVENTION

In the quest for improved performance, electronic circuits are becoming denser and devices smaller. For example, the most common gate dielectric in metal-oxide semiconductor field-effect transistors (MOSFETs) has been $SiO_2$. However, as the thickness of $SiO_2$ approaches 15 Å, substantial problems appear, including large leakage currents through the gate dielectric, concerns about the long-term dielectric reliability, and difficulty of manufacture and thickness control. A solution to the problem is to use thick films of materials, such as hafnium oxide ($HfO_2$) and/or zirconium oxide ($ZrO_2$) which have a dielectric constant larger than $SiO_2$. Thus, the physical thickness of the gate dielectric can be large, while the electrical equivalent thickness relative to $SiO_2$ films can be scaled. The electrical equivalent thickness (teq) of a high dielectric constant material, relative to $SiO_2$, for example, may be calculated by the formula:

$$t_{eq} = t_{phy}(\in_{SiO2}/\in_{high-k})$$

where $t_{phy}$ is the actual thickness of the substitute metal oxide gate dielectric, such as hafnium oxide, zirconium oxide, aluminum oxide, lanthanum oxide, yttrium oxide, lanthanum aluminum oxide, and the like, and where $\in_{SiO2}$ and $\in_{high-k}$ are the dielectric constants of $SiO_2$ and the metal oxide gate dielectric film, respectively. Similar problems are encountered in scaling capacitors in memory devices. As the circuits become denser and the devices smaller, a material with a higher capacitance, such as $HfO_2$, $ZrO_2$, or $Al_2O_3$, is necessary to store adequate charge in the capacitor. High-k dielectrics, such as $HfO_2$, $ZrO_2$, or $Al_2O_3$, have dielectric constants more than double the dielectric constant of $SiO_2$ (k=4) and are thus an attractive material for replacement of $SiO_2$ in transistors and capacitors. The term "high-k" denotes a dielectric having a dielectric constant of greater than $SiO_2$, preferably 7 or above.

Introduction of high-k dielectrics, such as $HfO_2$, $ZrO_2$, or $Al_2O_3$, in gate stacks have proven to reduce leakage current by several orders of magnitude. Such leakage reduction has enabled the fabrication of CMOS devices with low power consumption. Unfortunately, other problems have arisen from utilizing high-k dielectrics in CMOS devices including difficulty in passivating the underlying silicon, the introduction of unwanted charges in the gate stack which produce large flat band voltage shifts, large threshold voltage shifts, significant charge trapping, and low mobility devices.

Additionally, introduction of high-k dielectrics has necessitated deposition method development to ensure growth of high quality films. Previous work with high-k dielectric precursors have utilized conventional bubbler technology which involves a carrier gas bubbled through a neat (i.e., without solvent) precursor at an elevated temperature. The conventional bubbler technology relies on a consistent vapor pressure of the precursor to deliver a uniform precursor flux to the film and thus ensure a reproducible growth rate. However, control of growth rate necessary to achieve thin films (<100 Å) is difficult with conventional bubbler technology, due to fluctuations in precursor flux caused by variations in bubbler temperature, first run effects (bubbler held at elevated temperature in static conditions over time will have a higher volatilized precursor concentration, than a bubbler which is dynamically purged), and precursor volatility changes due to sintering of solids and/or precursor decomposition. Elevated temperatures and thermal cycling of a precursor in a conventional bubbler may contribute to premature degradation by ligand rearrangement, cluster formation, or oxidation of liquid and solid precursors over time. Additionally, precursor selection is critical to ensure adequate volatility, sufficient stability to prevent degradation during storage, transport, and vaporization and to ensure that the precursor has an optimal decomposition pathway to minimize impurities in the oxide film which would lead to degradation in electrical performance.

An additional problem with high-k dielectrics is that they tend to be oxygen deficient. To reduce leakage current associated with this oxygen deficiency, a post deposition anneal in oxygen at a high temperature is often conducted. This anneal in oxygen often grows an interfacial $SiO_2$ layer at the interface between the high-k dielectric and the underlying silicon. The interfacial $SiO_2$ layer reduces the effectiveness of the high-k dielectrics, since $SiO_2$ has a lower dielectric constant and thus reduces the effective capacitance of the film. Additionally, an interfacial layer may grow between the high-k dielectric and a top polysilicon electrode.

An additional problem associated with post deposition annealing of the above-mentioned high-k dielectrics is that during post deposition annealing, crystallization and grain growth may occur. As a result, the surface of the annealed film may roughen. Surface roughness causes non-uniform electrical fields in the channel region adjacent the dielectric film. Such films are not suitable for the gate dielectrics of MOSFET devices.

An additional problem associated with high-k dielectrics is their sensitivity to reducing conditions, specifically to forming gas anneals. To restore the silicon properties of the MOSFET/CMOS, the manufacturing process typically includes a forming gas or hydrogen anneal step, in which defects in the silicon such as dangling bonds are eliminated by utilizing the reducing effect of hydrogen. However, subjection of a metal oxide to a reducing environment commonly results in diminished electronic properties due to reduction of the metal oxide. Commonly, a dramatic increase in leakage current is observed. Strategies such as recovery anneal in oxygen to reoxidize the metal oxide has the disadvantage of negating the effect of the forming gas anneal on the underlying silicon. Encapsulation techniques and barrier layers to slow the diffusion of hydrogen to the metal oxide require additional processing steps and are not completely effective.

SUMMARY OF THE INVENTION

The applicants of the present invention have discovered that the method of depositing the high-k oxide including precursor selection, precursor delivery, growth conditions and Si substrate modification is critical in achieving a film which does not require a post deposition anneal, and is stable to reducing conditions necessary to passivate the underlying silicon. The applicants have also discovered that by careful selection of the CVD (chemical vapor deposition) precursor with optimal decomposition pathways, careful selection of the precursor delivery method, and careful selection of growth conditions, one can grow a smooth, crystalline, metal oxide film with suitable properties for incorporation into an electronic device without the need of a post deposition anneal. It has also been discovered that the resultant film is stable under reducing conditions necessary to passivate the underlying silicon. The applicants have further discovered that by careful selection of passivating conditions, one can fabricate a device with superior electrical properties with minimal flat band voltage shift, an appropriate threshold voltage, low inversion thickness, and enhanced mobility.

Additionally, the applicants have discovered that by utilizing a liquid delivery system and controlling the precursor concentration in the liquid, one can reliably and reproducibly control the film growth rate and thereby avoid the problems associated with conventional bubbler technology. Moreover, the applicants have discovered that by selecting an alkoxide precursor, which has a straightforward pyrolytic decomposition pathway, one can deposit films at higher temperatures while reducing both carbon and OH in the as deposited film and suppressing the formation of interfacial oxide between the high-k oxides and the underlying Si and top electrode during deposition and post deposition processing. The applicants have learned that this reduction in OH and C in the films and the suppression of interfacial oxides corresponds to improved electrical properties, less interfacial states, fewer traps, lower leakage, and improved dielectric constant. Additionally, by depositing the high-k oxide films at higher temperatures the applicants have discovered that a post deposition anneal is not needed and that the resultant films are denser, microcrystalline, atomically smooth, and stable to reducing conditions necessary to passivate the underlying silicon. Additionally, by utilizing a hydrogen plasma passivation or forming gas anneal, one can reduce the number of interface states with minimal or no loss of accumulation capacitance.

The present invention relates to method of depositing hafnium oxide and/or zirconium oxide films by chemical vapor deposition (CVD). The present invention is also directed to a method of fabricating electronic devices that contain hafnium oxide and/or zirconium oxide deposited by the inventive method. The present invention is also directed to a method of passivating electronic devices that contain hafnium oxide and/or zirconium oxide deposited by the inventive method. Suitable electronic devices that can be fabricated in the present invention include, but are not limited to: transistors, capacitors, diodes, resistors, switches, light emitting diodes, lasers, wiring structures, interconnect structures or any other electronic structure wherein the film of the present invention can be incorporated therein.

In a broad aspect, the present invention relates to chemical vapor deposition of hafnium oxide and/or zirconium oxide utilizing a hafnium and/or zirconium alkoxide precursor dissolved, emulsified or suspended in a liquid, vaporizing at least the alkoxide precursor, and depositing a constituent of the vaporized precursor on a substrate to form a film at a deposition temperature of greater than 400° C. In this aspect the liquid, may or may not be co-vaporized with the alkoxide precursor. In one embodiment of the present invention, the liquid is vaporized with the alkoxide precursor. In an alternative embodiment of the present invention, the liquid is not vaporized and is diverted from the reactor in liquid form. The term "liquid" is used herein to denote any liquid which does not substantially react with the alkoxide precursor. That is, any 'inert' liquid may be employed in the present invention.

Specifically, preferred hafnium and/or zirconium alkoxide precursors include, but are not limited to: hafnium or zirconium isopropoxide, hafnium or zirconium sec-butoxide, hafnium or zirconium ethoxide, hafnium or zirconium isobutoxide, hafnium or zirconium methoxide, hafnium or zirconium neo-pentoxide, hafnium or zirconium propoxide, hafnium or zirconium butoxide, hafnium or zirconium tertiary butoxide, or hafnium or zirconium phenoxide.

Another aspect of the present invention relates to the fabrication of multilayer structures incorporating hafnium oxide and/or zirconium oxide deposited by the inventive method.

A yet other aspect of the present invention relates broadly to passivation of multilayer structures incorporating hafnium oxide and/or zirconium oxide deposited by the inventive method.

Further aspects of the present invention include:

Fabricating an electronic structure incorporating a film deposited by the inventive method.

Fabricating a complementary metal oxide semiconductor (CMOS) integrated circuit logic device which contains both n-type field effect transistors (NFET) and p-type field effect transistors (PFET) formed on a single substrate incorporating a film deposited by the inventive method.

Fabricating an integrated circuit capacitor incorporating a film deposited by the inventive method.

DETAILED DESCRIPTION OF THE INVENTION

Figure 1:
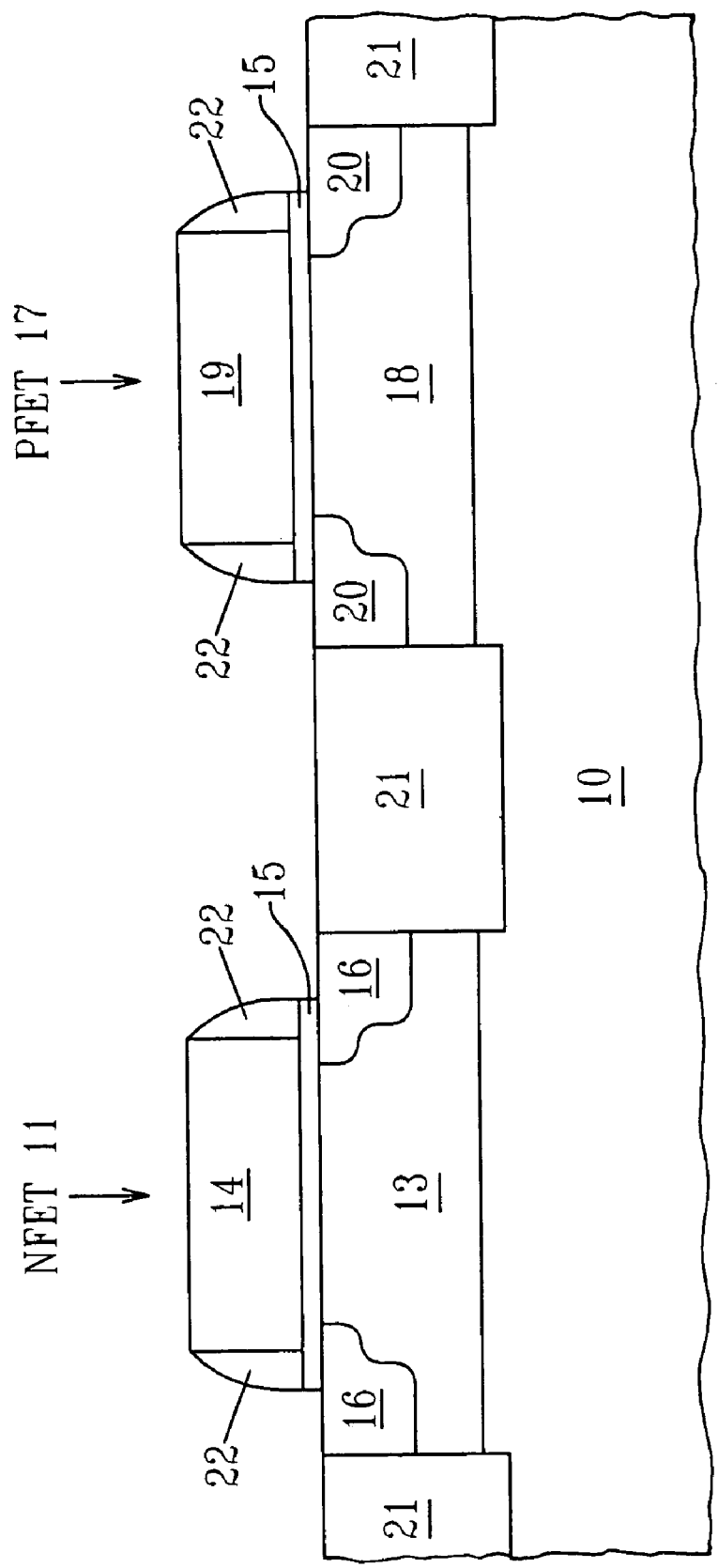
FIG. 1 is an illustration of a cross-sectional view of an integrated circuit of the present invention with both PFET and NFET devices on a single substrate.

As stated above, the present invention broadly relates to chemical vapor deposition of hafnium oxide and/or zirconium oxide, and fabrication of an electronic device incorporating a film deposited by the inventive method. More specifically, the present invention relates broadly to chemical vapor deposition of hafnium oxide and/or zirconium oxide utilizing a hafnium or zirconium alkoxide precursor dissolved, emulsified or suspended in a liquid, vaporizing at least the alkoxide precursor, and depositing a constituent of the vaporized precursor on a substrate to form a film at a deposition temperature >400° C.

The precursor employed in the present invention is defined as any hafnium or zirconium alkoxide. Mixtures containing the same or different metal are also contemplated herein. A generalized formula for the precursor of the present invention is $M(OR)_4$ where M is Zr or Hf, R is a ligand selected from linear or branched $C_{1-22}$, preferably $C_{1-12}$, alkyl or phenyl radicals. The preferred precursors are hafnium or zirconium isopropoxide, hafnium or zirconium sec-butoxide, hafnium or zirconium ethoxide, hafnium or zirconium isobutoxide, hafnium or zirconium methoxide, hafnium or zirconium propoxide, hafnium or zirconium butoxide, hafnium or zirconium tertiary butoxide, or hafnium or zirconium phenoxide.

The liquid which is employed in the present invention is selected from aliphatic hydrocarbons, aromatic hydrocarbons, alcohols, ethers, aldehydes, ketones, acids, phenols, esters, amines, alkylnitrile, halgonated hydrocarbons, silyated hydrocarbons, thioethers, amines, cyanates, isocyanates, thiocyanates, silicone oils, nitroalkyl, alkylnitrate and/or mixtures of one or more of the above. The alkoxide precursor may be dissolved, emulsified or suspended in the liquid. The above-mentioned liquids are inert in that the liquid does not react substantially with the alkoxide precursor.

The method of hafnium oxide and/or zirconium oxide deposition of the present invention can be used in any CVD process with any delivery means. Thus, the invention is not limited to a specific CVD apparatus or delivery system. Chemical vapor deposition (CVD) is defined as introduction of multiple reagents into a reactor either simultaneously or sequentially, digital chemical vapor deposition, pulsed chemical vapor deposition and other like methods.

In accordance with the present invention, a liquid precursor mixture including the metal alkoxide precursor (or mixtures thereof) and the liquid is first provided. The liquid precursor mixture includes from about 0.05 to about 0.4 molar metal alkoxide precursor dissolved, suspended or emulsified in 100%, by weight, of the liquid. More preferably, the liquid precursor mixture includes from about 0.1 to about 0.2 molar metal alkoxide precursor dissolved, suspended or emulsified in 100%, by weight, of the liquid.

The liquid precursor mixture may be formed outside the reactor chamber of a CVD deposition apparatus, or alternatively the mixture may be formed inside the reactor chamber itself. In some embodiments, an inert gas such as He, Ar, Ne, Kr, Xe or mixtures thereof can be introduced in the portion of apparatus that includes the liquid precursor mixture. The flow rate of the liquid precursor mixture may be from about 40 to about 200 mg/min., with a flow rate of from about 5 to about 100 mg/min. being more preferred.

The term "dissolved" is used in the present invention to denote that the metal alkoxide precursor is substantially distributed more or less evenly throughout the liquid. The term "emulsified" denotes that the metal alkoxide precursor is substantially dispersed in an immiscible liquid as droplets that are typically larger than colloidal size. The term "suspended" denotes that particles of the metal alkoxide precursor are mixed with, but not completely dissolved, in the liquid.

The liquid precursor mixture thus formed is then vaporized in a vaporizer at a temperature of from about 25° to about 250° C., with a temperature of from about 50° to about 80° C. being more highly preferred. It is noted that the above temperatures are sufficiently high enough to at least vaporize the metal alkoxide precursor. Thus, the vaporization step may include only vaporization of the metal alkoxide, without vaporization of the liquid. In this embodiment, the unvaporized liquid is typically, but not always, removed from the reactor in liquid form. In another embodiment of the present invention, the liquid and metal alkoxide precursor are vaporized together, i.e., they are co-vaporized.

Anhydrous $N_2$ may be introduced in the vaporizer at a flow rate of from about 0 to about 1000 sccm, with a flow rate of from about 40 to about 800 sccm being more highly preferred.

Notwithstanding whether co-vaporization or vaporization of only the metal alkoxide precursor occurs, the vaporized precursor component is applied, via deposition, onto a substrate using a deposition temperature of greater than 400° C. More preferably, the deposition temperature is from about 450° to about 1000° C. The pressure during the growth of the inventive film of $HfO_2$ and/or $ZrO_2$ is from about 1 milliTorr to about 100 Torr, with a pressure of from about 0.3 to about 2 Torr being more highly preferred.

During the deposition process, the vaporized precursor may be used in the presence of a reactant gas, which includes an oxygen-containing source. Suitable reactant gases include, but are not limited to: oxygen, $N_2O$, NO, $H_2O$ or ozone. A preferred reactant gas is oxygen.

As stated above, any CVD process (including apparatus and delivery systems) can be used in the present invention.

The term "substrate" is used in the present invention to denote any semiconducting material such as, for example, Si, Ge, SiGe, InAs and the like; insulating materials including any inorganic dielectric or organic dielectric; or any conductive material including polysilicon, metal silicides, metal nitrides and elemental metals or alloys. The term 'substrate' thus denotes any component of a front-end or back-end of the line device.

The above deposition process results in the formation of a high-k oxide film of Zr, Hf or a mixture thereof onto the substrate. The thickness of the inventive film may vary depending on the deposition conditions and amount of metal alkoxide present in the vaporized precursor, but typically the inventive film has a thickness of from about 5 to about 5000 Å.

The inventive film is a dense film including a microcrystalline grain structure having a grain size of about 10 nm or less. More preferably, the inventive film has a grain size of from about 0.2 to about 6.5 nm. The inventive film contains little or no FTIR detectable amounts of C or OH.

Another characteristic feature of the inventive high-k oxide film is that the film forms an atomically smooth interface with the underlying substrate. By "atomically smooth" it is meant that the interface between the substrate and the deposited film is substantially continuous across the entire substrate. Additionally, the inventive film has improved surface roughness which means that substantially no defect regions such as divots are present on the upper surface of the inventive film A yet further characteristic feature of the inventive high-k oxide film is that the film is stable to reducing conditions necessary to passivate the underlying substrate. Without wishing to be bound by any theory, it is believed that this stabilization to reducing conditions is caused by the dense films of the present invention which contain little or no FTIR detectable amounts of C or OH.

One aspect of the present invention relates broadly to fabrication of a structure of a complementary metal oxide semiconductor (CMOS) integrated circuit logic device incorporating hafnium oxide and/or zirconium oxide deposited by the inventive method. More specifically, the present invention relates to the fabrication of a CMOS integrated circuit that contains both n-type field effect transistors (NFET) and p-type field effect transistors (PFET) formed on a single substrate 10. As shown in FIG. 1, NFET device 11 is formed on a p-type conductivity region 13 of substrate 10 and contains a gate electrode 14 formed on a gate dielectric 15 and a pair of n-type source/drain regions 16 formed on laterally opposite sides of gate electrode 14. Similarly, PFET device 17 is formed on a n-type conductivity region 18 of substrate 10 and contains the gate electrode 19 formed on gate dielectric 15 and a pair of p-type conductivity source/drain regions 20 formed along opposite sidewalls of gate electrode 19. The NFET and PFET devices are separated by shallow trench isolation 21 and by spacers 22. In this aspect of the invention, gate dielectric 15 incorporates hafnium oxide and/or zirconium oxide deposited by the inventive method.

Figure 2:
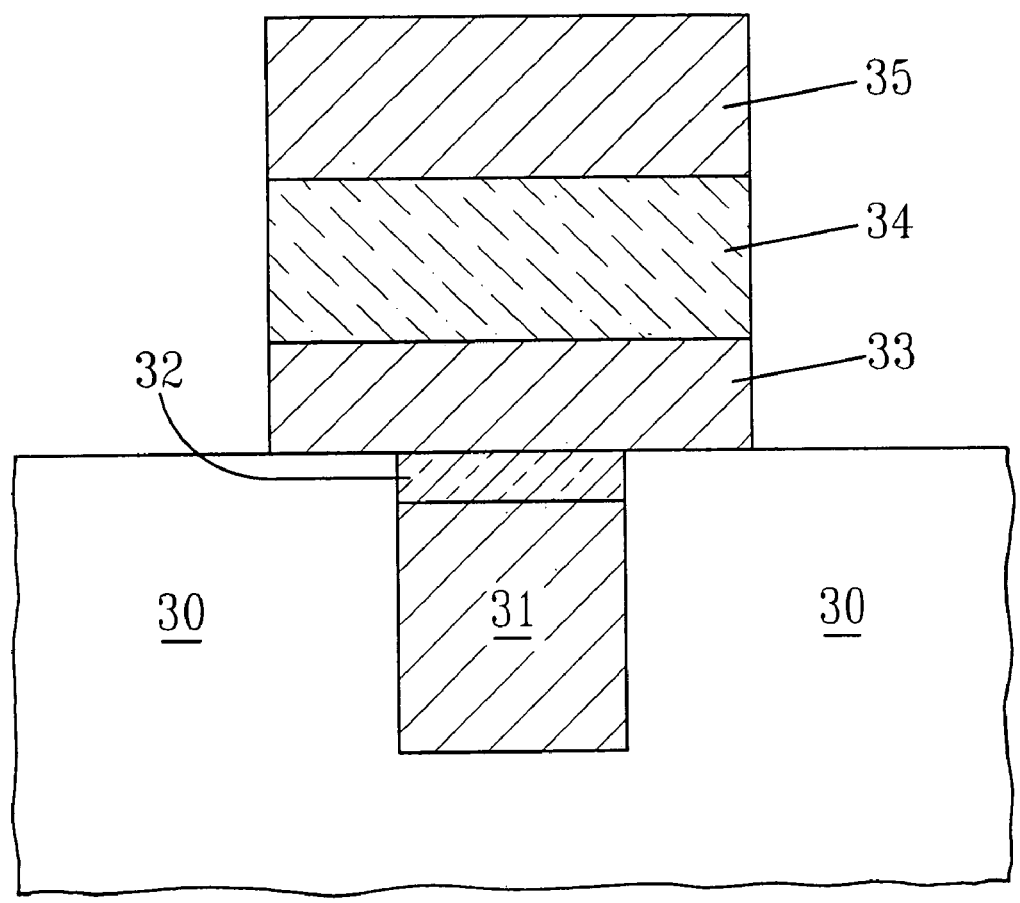
FIG. 2 is an illustration of a cross-sectional view of an integrated circuit capacitor of the present invention.

Another aspect of the present invention relates broadly to fabrication of a structure of an integrated circuit capacitor incorporating hafnium oxide and/or zirconium oxide deposited by the inventive method. More specifically, the present invention relates to the fabrication of a capacitor. As shown in FIG. 2, a typical capacitor is formed on a substrate 30, connected by a plug 31 to a transistor, with a barrier 32 and consists of a bottom electrode 33, a dielectric material 34, and a top electrode 35. In this aspect of the invention, the dielectric material 34 incorporates hafnium oxide and/or zirconium oxide deposited by the inventive method. The capacitor may be stack or trench.

Although the inventive high-k oxide film can be used in various electronic devices, it is preferred to use the high-k oxide in devices wherein a conductive material, such as, Ni, W, Mo, Ti, Cr, Te, Cu, Pd, Pt, Be, Au, Ir, Ta, Rh, Fe, Mn, Nb, V, Re, Ag, Bi, Cd, Ga, Hf, In, Y, Zr, TaN, TaSiN, TiAlN, TiSiN, TaWN, TiWN, TaAlN, NbN, ZrN, TaTiN, $IrO_2$, SiC, TiNPt, TiAlN-PT, Ru, $RuO_2$, RuPt, WSi, TiSi, dopped and undoped polysilicon, Al, $IrO_x$, Os, $OsO_x$, MoSi, $ReO_2$, doped or undoped alloys, mixtures and mutilayers, preferably W, is formed thereon. The conductive material may be formed utilizing any suitable deposition process, such as, CVD, plating, evaporation, metal seed deposition and the like.

In such embodiments, and when Al is employed as the conductive material, it has been determined that the high-k oxide film provides passivation during an $H_2$ plasma treatment process or a conventional forming gas anneal. In particular, it has been determined that Al reacts with trapped water at the Al/Hf and/or Zr oxide interface forming a thin $Al_2O_3$ layer which releases H. The released H facilitates the passivation of the stack.

The above is a generic description of the present invention, the following description provides specific details of the present invention as well as some advantages that can be obtained therefrom.

EXAMPLE 1

Chemical Vapor Deposition of Hafnium Oxide

The hafnium oxide films were deposited in a quartz horizontal hot wall CVD reactor equipped with a 1×3×8" quartz flow cell. An ATMI (Advanced Technology and Materials, Inc. Danbury, CT) LDS 300B liquid delivery system and vaporizer was used to introduce precursors into the reactor. The hafnium alkoxide source mixture was comprised of 40 grams of hafnium tert-butoxide $Hf(t-OC4H_9)_4$ and 1 liter of octane. A thin layer (<20 Å) of $SiO_xN_y$ layer was deposited on the silicon wafer prior to growth of hafnium oxide. The hafnium alkoxide source mixture was flowed at 0.5–0.01 ml/min, preferably 0.05 ml/min. The vaporizer temperature was 120–180° C., preferably 120° C. Anhydrous nitrogen was introduced into the vaporizer at 20–2000 sccm, preferably 200 sccm as a carrier gas for the volatilized hafnium isopropoxide. A reactant gas selected from the group including, oxygen, $N_2O$, NO, $H_2O$, ozone, preferably, oxygen was introduced through a separate inlet as the reactant gas. The system pressure was 5 Torr during growth. The substrate was heated by an external high intensity infrared lamp and the susceptor was comprised of Hastalloy. The temperature of the susceptor was monitored by insertion of a thermocouple into the susceptor. Hafnium oxide was deposited at 300–700° C., preferably at temperatures >400° C.

Figure 3:
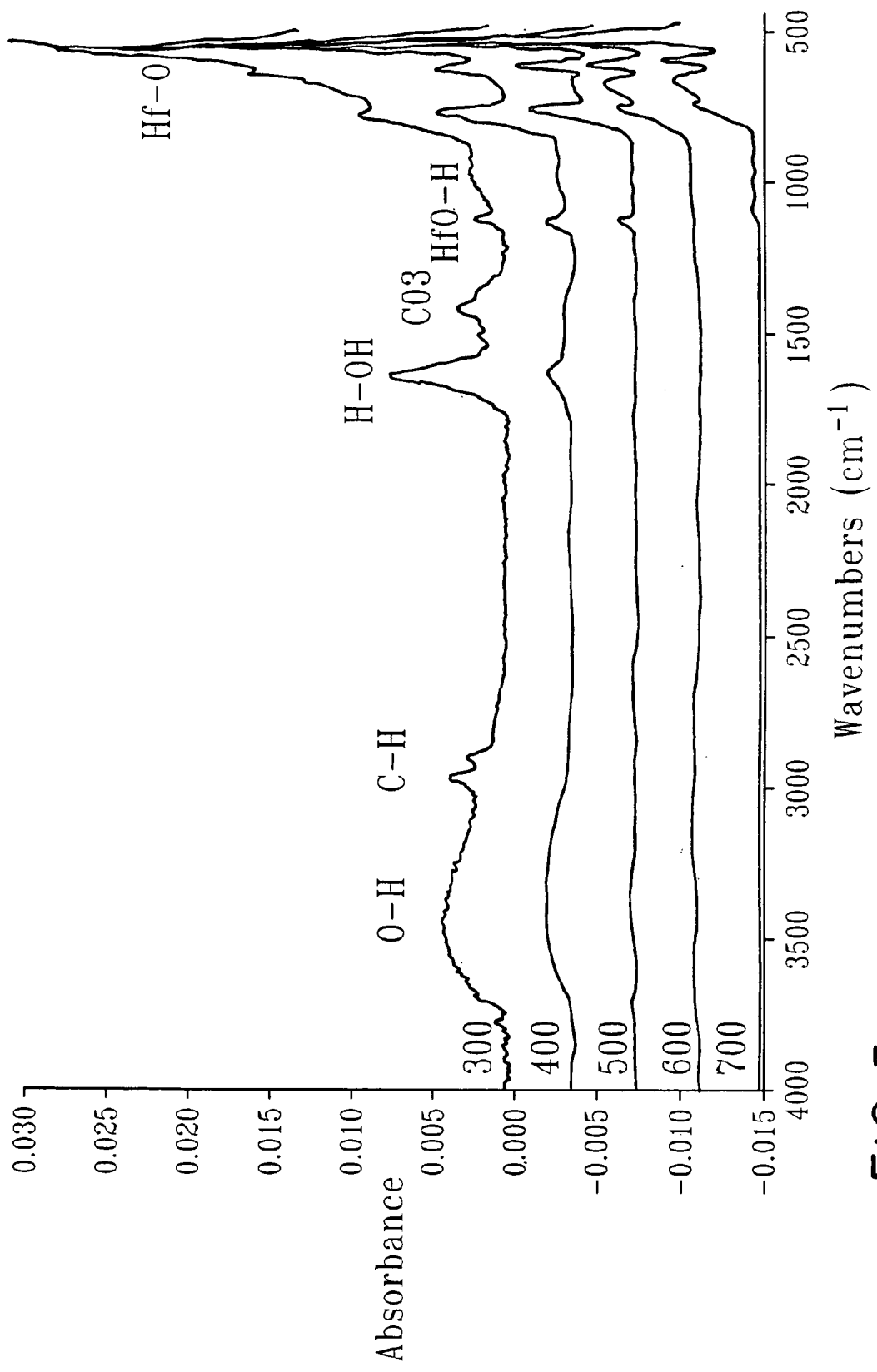
FIG. 3 is a FTIR spectrum of as deposited hafnium oxide films of the present invention.

As shown in the FTIR spectra of the as deposited films (FIG. 3), the hafnium oxide film deposited at 300° C. was not crystalline and absorption bands attributable to OH, $H_2O$, CH and carbonate were observed. The hafnium oxide film deposited at 400° C. was crystalline but absorption bands attributable to OH, $H_2O$, CH and carbonate were observed in the FTIR spectrum. However at deposition temperature of 500° C. and greater, absorption bands attributable to OH, $H_2O$, CH and carbonate are not observed.

Figure 4:
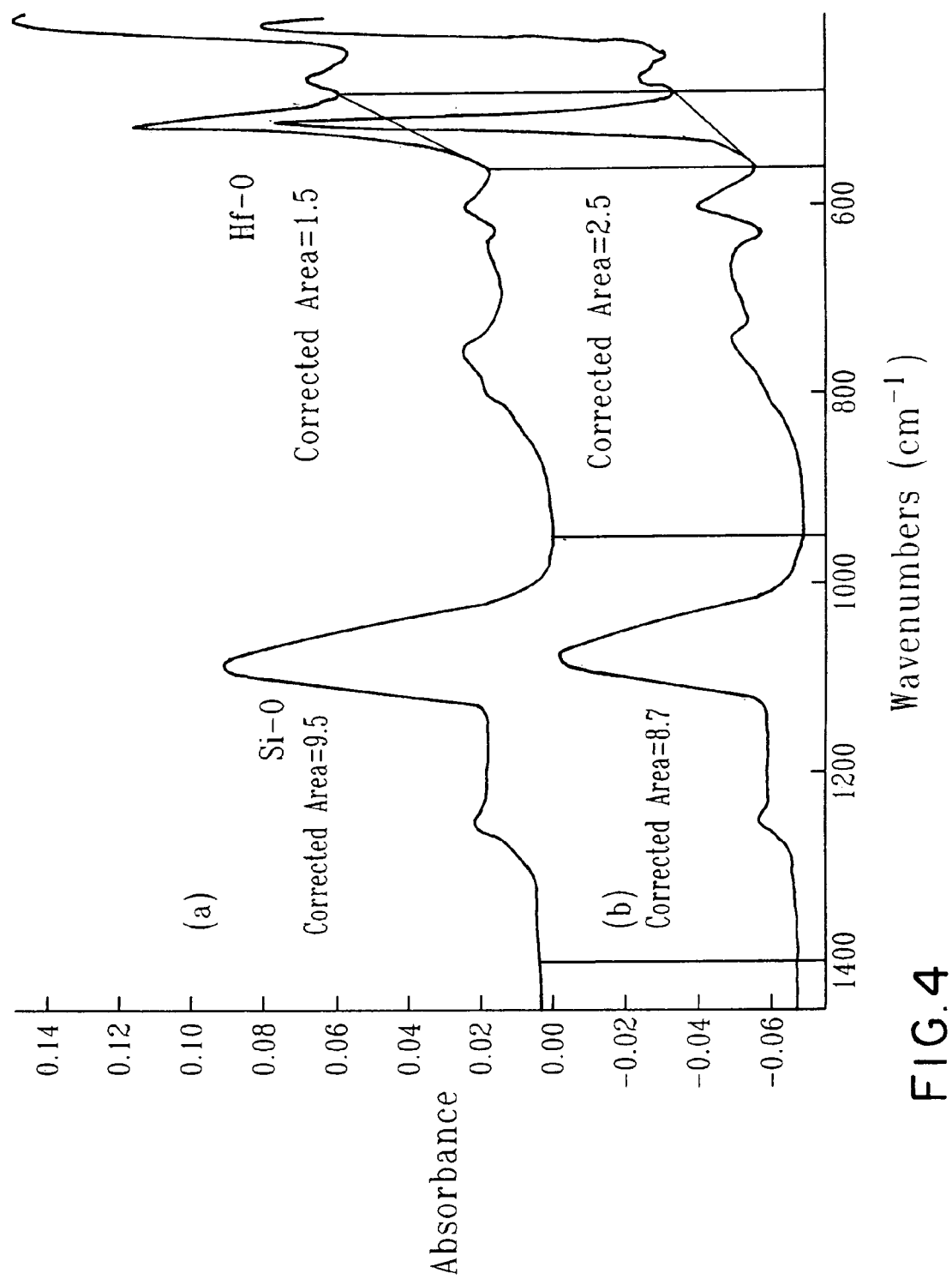
FIG. 4 is a FTIR spectrum of annealed hafnium oxide films of the present invention.

As shown in FIG. 4, annealing the $HfO_2$ film deposited at 400° C. and 600° C. at 1000° C. for 30 min in oxygen resulted in the formation of $SiO_2$. Strong absorptions assignable to $SiO_2$ were observed at 1200 and 1080 $cm^{-1}$ and are ascribed to the LO and TO components of the asymmetric stretch of the $SiO_4$ unit, respectively. The absorption bands at 460 $cm^{-1}$ are attributed to skeletal network Si—O—Si symmetric bond bending. The remaining absorption bands are assigned to Hf—O stretching and bending vibrations. In the films deposited at 400° C. and post annealed at 1000° C. for 30 min, the relative calculated peak area under the Si—O peaks at 1200 and 1080 $cm^{-1}$ is 6.3 times the amount under the Hf—O peak at 512 $cm^{-1}$. However, in the $HfO_2$ film deposited at 600° C. and post annealed at 1000° C. for 30 min, the relative calculated peak area under the Si—O peaks is only 3.5 times the amount under the Hf—O peak. Hafnium oxide deposited at temperatures less than 400° C. contains significant quantities of OH and/or absorbed water as observed in the FTIR spectra and are less dense, facilitating the formation of an interfacial oxide layer during post deposition annealing.

EXAMPLE 2

Chemical Vapor Deposition of Hafnium Oxide

The hafnium oxide films were deposited in a single wafer, lamp heated susceptor type CVD reactor equipped with a 300 mm showerhead as supplied by TEL. A liquid delivery system and vaporizer was used to introduce precursors into the reactor. The hafnium alkoxide source mixture was comprised of 40 grams of hafnium tert-butoxide and 1 liter of octane. A thin layer (<20 Å) of ultra-thin ($SiO_2$) oxide (UTO) or rapid thermal thin oxide containing nitrogen (RTNO) was deposited on the silicon wafer prior to growth of hafnium oxide. The hafnium alkoxide source mixture was flowed at between 1 and 400 mg/min, preferably 80. The vaporizer temperature was 30–300° C., preferably 50° C. Anhydrous nitrogen was introduced into the vaporizer at 10–2000 sccm, preferably 40 sccm as a carrier gas for the volatilized hafnium tert-butoxide. Oxygen was introduced through a separate inlet as the reactant gas. The system pressure was 1 mT to 100 Torr during growth, preferably 1.5 Torr. The substrate was heated by an external high intensity infrared lamp and the susceptor was comprised of AlN. The temperature of the susceptor was monitored by insertion of a thermocouple into the susceptor. Hafnium oxide was deposited at 250–850° C., preferably at 500° C.

EXAMPLE 3

Chemical Vapor Deposition of Hafnium Oxide

In this embodiment, the liquid is not vaporized and is diverted from the CVD reactor. The hafnium alkoxide is dissolved, emulsified or suspended in a liquid which vaporizes at a higher temperature. The hafnium alkoxide and the liquid is introduced into a vaporizer where the hafnium alkoxide is vaporized. The liquid is not vaporized, but instead is diverted from the reactor in liquid form.

Figure 5:
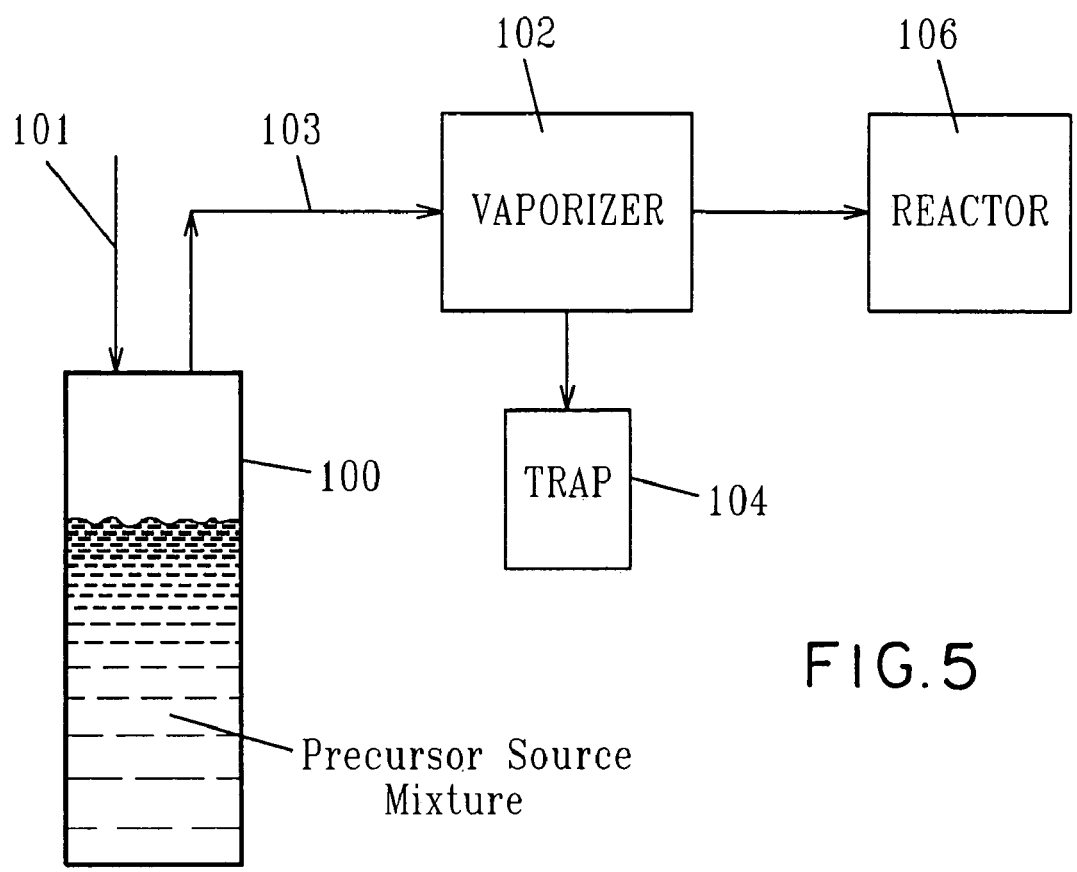
FIG. 5 is a schematic representation of a delivery system that can be used in the present invention for chemical vapor deposition of a film or coating.

One possible apparatus configuration is shown in FIG. 5. As shown in FIG. 5, the hafnium alkoxide and liquid would flow from ampoule 100 to vaporizer 102. The hafnium alkoxide is volatilized in the vaporizer, but the liquid would not. The vaporized hafnium alkoxide is then transported to reactor 106, and the nonvaporized inert liquid is drained out of the vaporizer and collected in trap 04. The vaporizer temperature is set at less than the boiling point of the liquid. Inlet 101 and outlet 103 are also shown, together with arrows which depict the flow within the reactor.

One preferred method would be hafnium isopropoxide and dodecane (boiling point 216° C.) with the vaporizer temperature set at 60° C., and the deposition temperature >400° C.

EXAMPLE 4

Fabrication of Passivated Al/HfO$_2$/Si Capacitor

Figure 6:
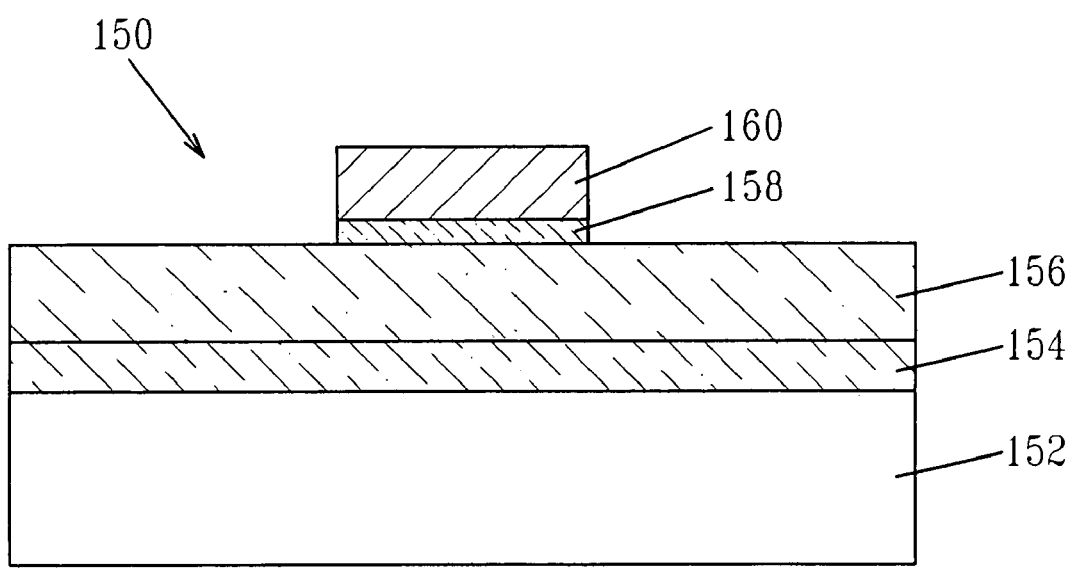
FIG. 6 is a cross-sectional view of Al/HfO$_2$/capacitor structure made using the inventive method.

FIG. 6 depicts a Al/HfO$_2$/capacitor structure 150 that can be formed using the method of the present invention. A thin layer (<20 Å) of ultra-thin ($SiO_2$) oxide (UTO) or rapid thermal thin oxide 154 containing nitrogen (RTNO) was deposited on the silicon wafer 152 prior to growth of hafnium oxide. The hafnium oxide film 156 having a thickness of about 20 Å was deposited as described in example 2. Capacitors were formed by Al 160 evaporation through a shadow Si mask with the substrates held at room temperature. Capacitor area is 5.6E–4 cm$^2$. The Al/HfO$_2$/RTNO/Si stack was passivated by annealing in air at 315° C. It is theorized that when annealed in air at 315° C., the Al reacts with trapped water at the Al/HfO$_2$ interface to form a thin $Al_2O_3$ layer 158 releasing H which passivates the gate stack.

Figure 7:
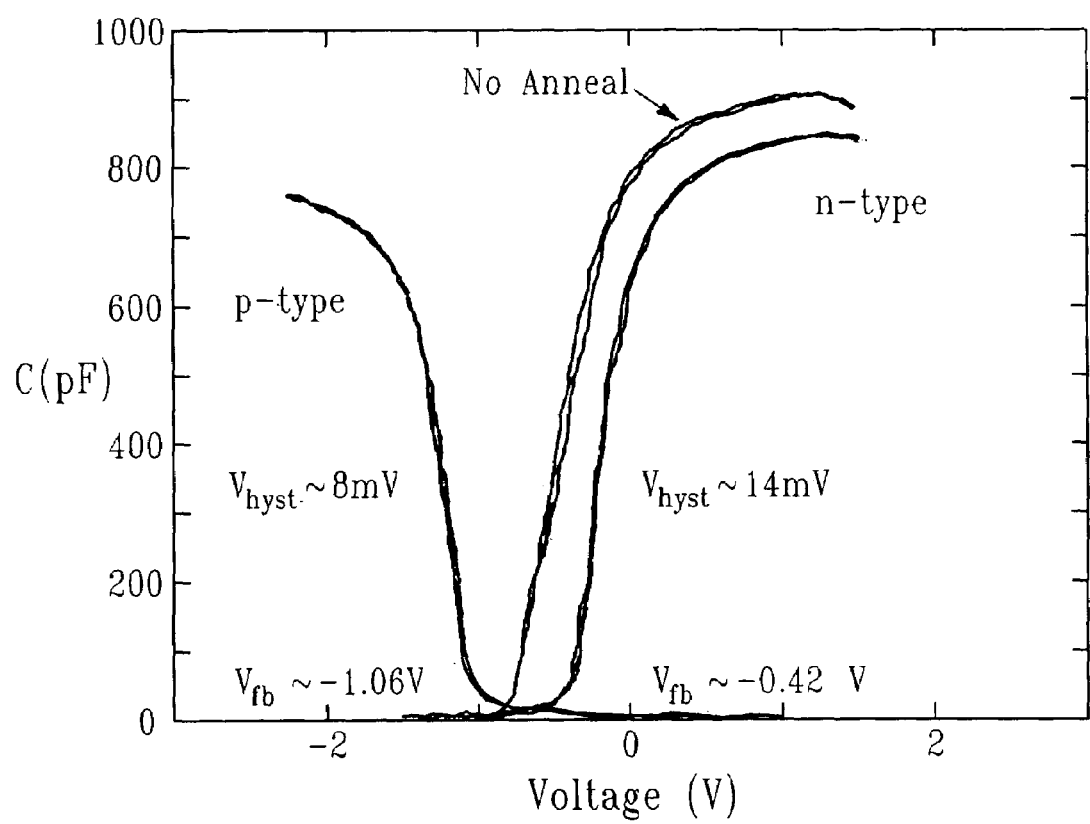
FIG. 7 shows the capacitance voltage (CV) characteristics for a passivated Al/HfO$_2$/capacitor structure fabricated in accordance with the present invention.

The nearly ideal capacitance voltage (CV) characteristics at 100 Khz are depicted in FIG. 7 for n and p type substrates. The flat band voltage is ~–1V for p-type substrate and –0.4V for the n type which are close to ideal. For the p-type capacitor, the HfO$_2$ was formed on an ultra-thin ($SiO_2$) oxide (UTO) and for the n-type the HfO$_2$ was formed on rapid thermal thin oxide containing nitrogen (RTNO). Hystersis is about 8 mV for the p-type and 14 mV for the n-type. The CV characteristics for a n-type capacitors which received no anneal is also shown in FIG. 7. In this case, the flatband shift is about –0.8V which is far from ideal when compared with the passivated capacitor.

Figure 8:
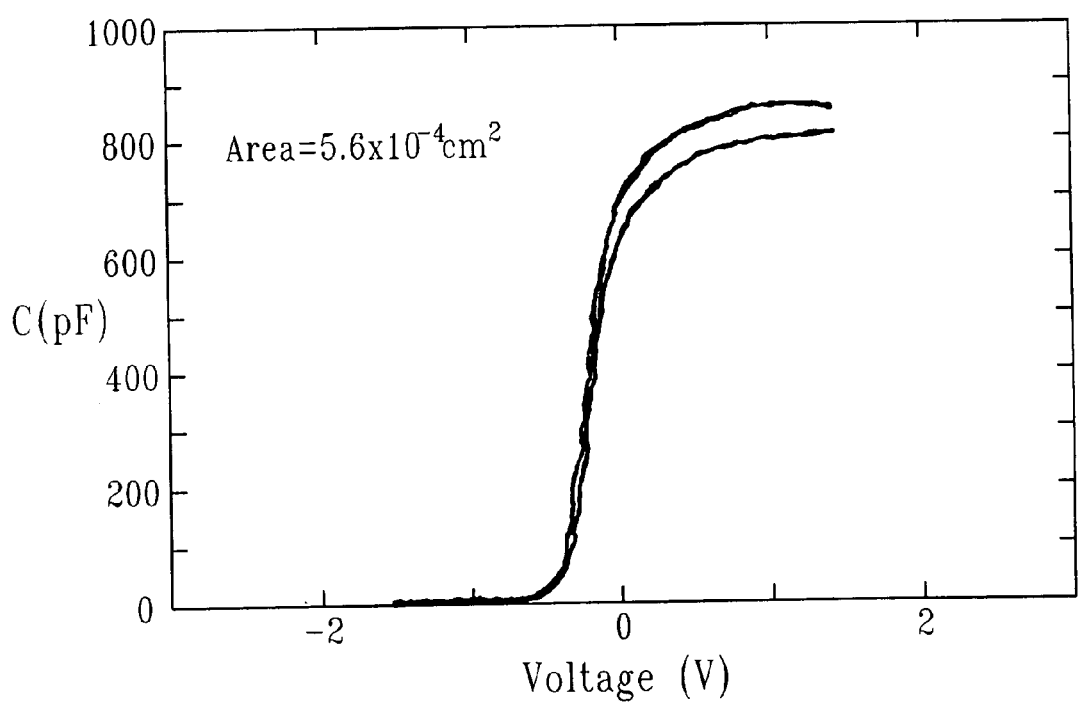
FIG. 8 shows the CV characteristics for a passivated Al/HfO$_2$/capacitor structure with two different HfO$_2$ thicknesses fabricated in accordance with the present invention.

FIG. 8 shows CV characteristics for two different HfO$_2$ thicknesses. Note that the flat band voltage does not shift with film thickness indicating that the stack has low fixed charge and passivation has occurred at the bottom interface near the Si substrate.

EXAMPLE 5

Fabrication of Passivated W/HfO$_2$/Si Capacitor

Figure 9:
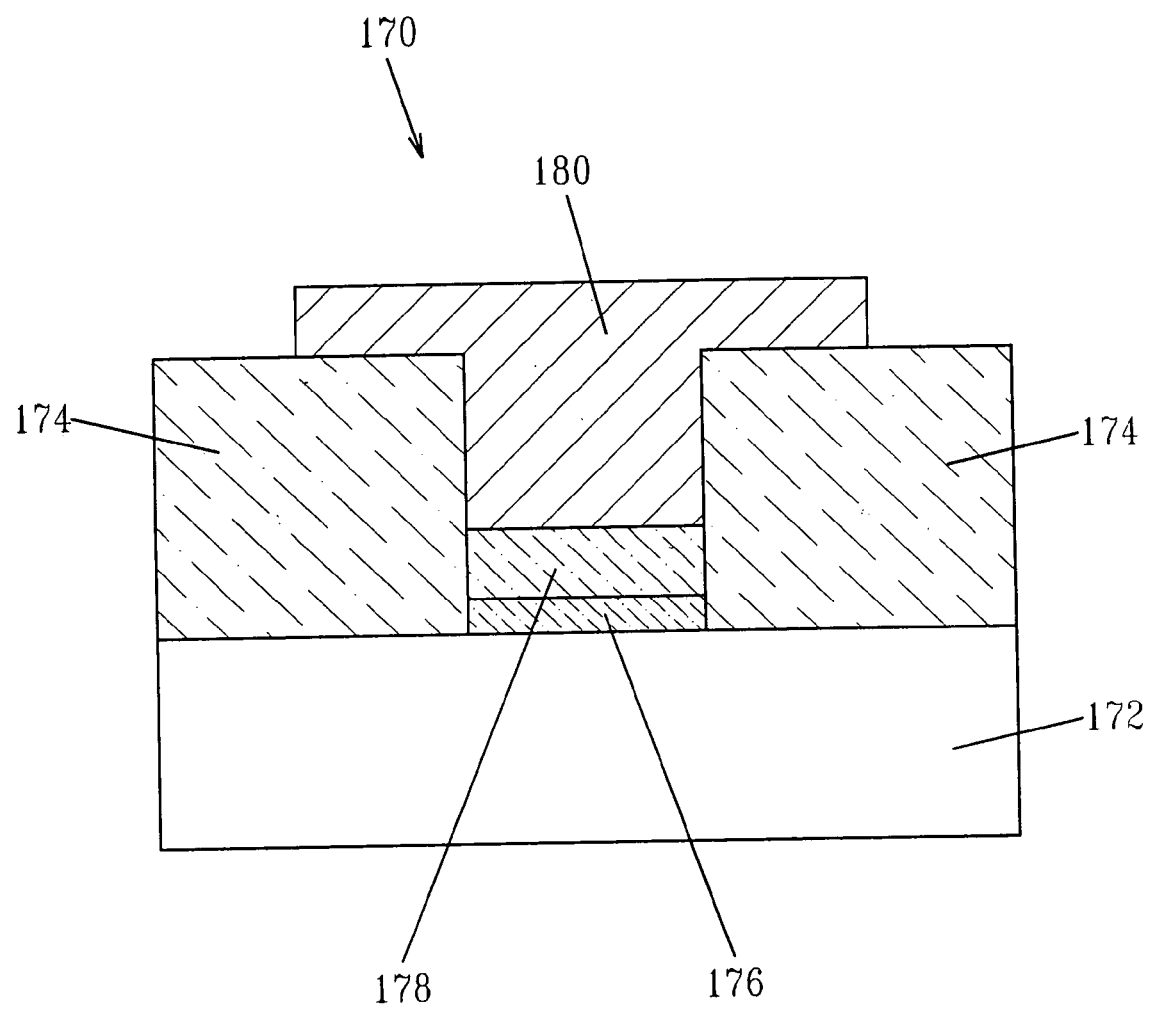
FIG. 9 is a cross-sectional view of a W/HfO$_2$/RTNO capacitor fabricated using the method of the present invention.

FIG. 9 shows the structure of a W/HfO$_2$/RTNO capacitor 170 which can be formed using the inventive method.

Vias are etched into blanket SiO$_2$ 174 on n+Si 172. The vias in the thick SiO$_2$ define the capacitor area. At the bottom of the via a thin layer (<20 Å) of ultra-thin (SiO$_2$) oxide (UTO) or rapid thermal thin oxide containing nitrogen (RTNO) 176 was deposited on the silicon wafer prior to growth of hafnium oxide 178. The hafnium oxide films were deposited as described in example 2. The W top electrode 180 is deposited by chemical vapor deposition. The W is patterned by masking off the capacitor area with photoresist and etching the unmasked areas in a wet process.

Figure 10:
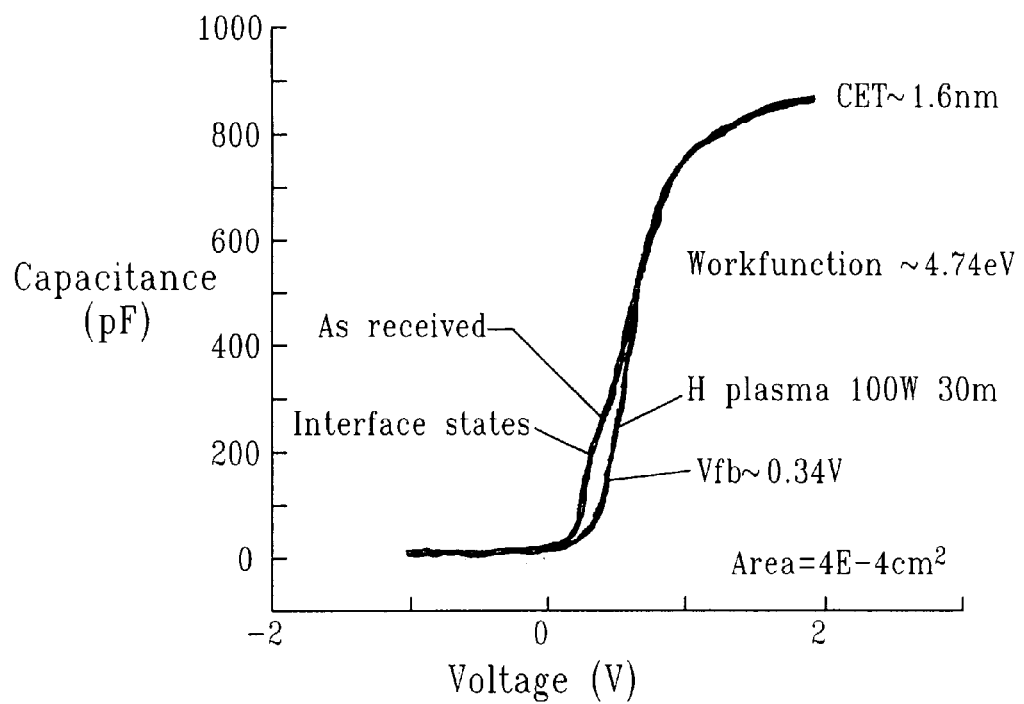
FIG. 10 shows the CV characteristics of W/HfO$_2$/RTNO gate stack before, and after H plasma passivation.

The capacitor is passivated by using a 13 MHz rf generated H plasma in a parallel plate configuration. The rf cathode was 8 inches in diameter. The substrate was grounded. Process was carried out at 0.1 mTorr to 100 torr, preferably, 100 mTorr with a substrate temperature between 25–900° C., preferably, 350° C., 1–1000 Watts, preferably, 100 Watts, for 1 s–6 hours, preferably 30 minutes. The CV characteristics of the W/HfO$_2$/RTNO capacitor are shown in FIG. 10. Before passivation the CV shows clear evidence of interface states. After the H plasma passivation, reduction of interface states is achieved. Note that by using 100 W for 30 min a smooth CV is obtained with no loss of accumulation capacitance. By increasing H plasma power we found that accumulation capacitance was reduced with an increase of equivalent oxide thickness. After passivation at 100 W for 30 min, the flat band voltage is 0.34V which corresponds to a work function of 4.74 eV ideal for W.

Figure 11:
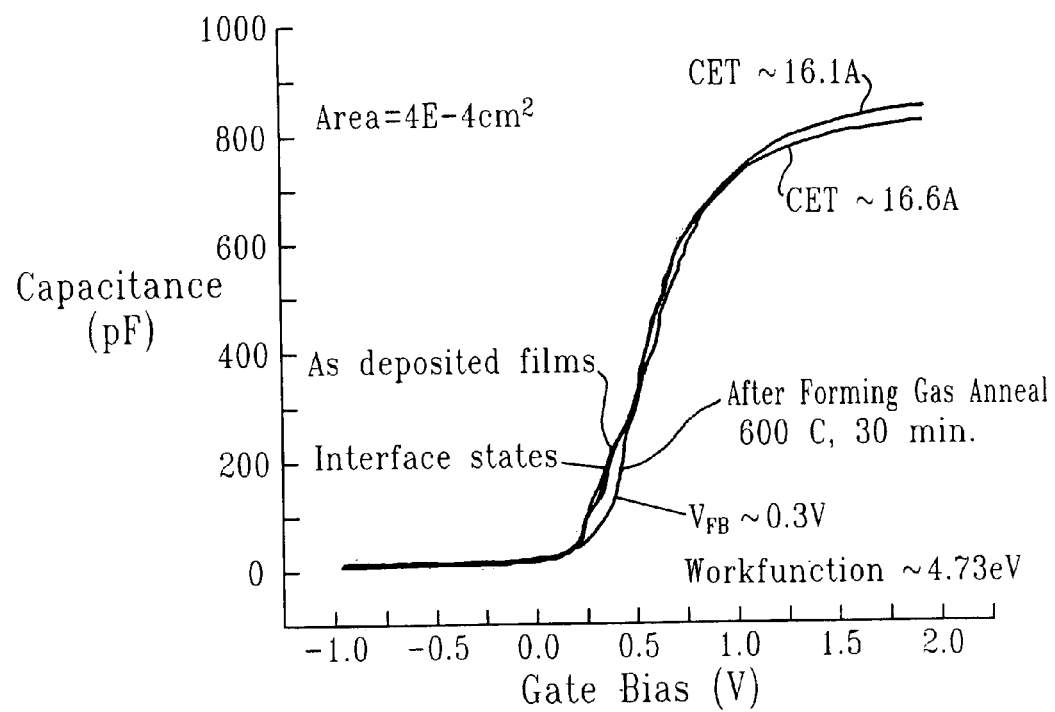
FIG. 11 shows the CV characteristics of W/HfO$_2$/RTNO gate stack before, and after forming gas passivation.

FIG. 11 shows the same stack capacitors W/HfO$_2$/RTNO furnace annealed in forming gas (5% H2 in N2). In this case, best passivation was achieved by using a temperature of 600° C. for 30 m. Also as in the case of H plasma passivation, interface states are reduced as shown in FIG. 11 and W workfunction is ~4.74 eV.

Figure 12:
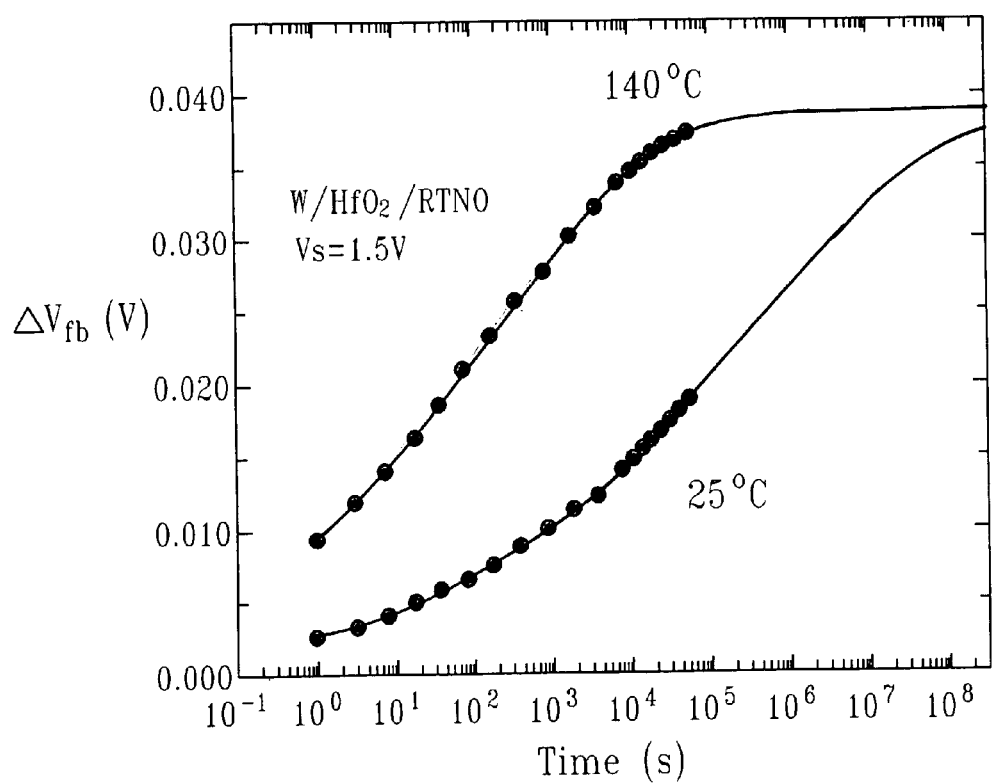
FIG. 12 shows the charge trapping as a function of stress time at stress voltage of 1.5 V and varying temperatures (140° C. and 25° C.) for H plasma passivated W/HfO$_2$/RTNO capacitors.

FIG. 12 shows charge trapping as a function of stress time at stress voltage of 1.5 V and varying temperatures (140° C. and 25° C.) for capacitors passivated by the Hydrogen plasma at 100 W for 30 minutes. The symbols are the measurements and solid lines are the model calculations for estimating lifetimes. The estimated lifetime at 10 years of stressing and operating conditions of 1.5 V and 140° C. meet the reliability specification for charge trapping.

Figure 13A:
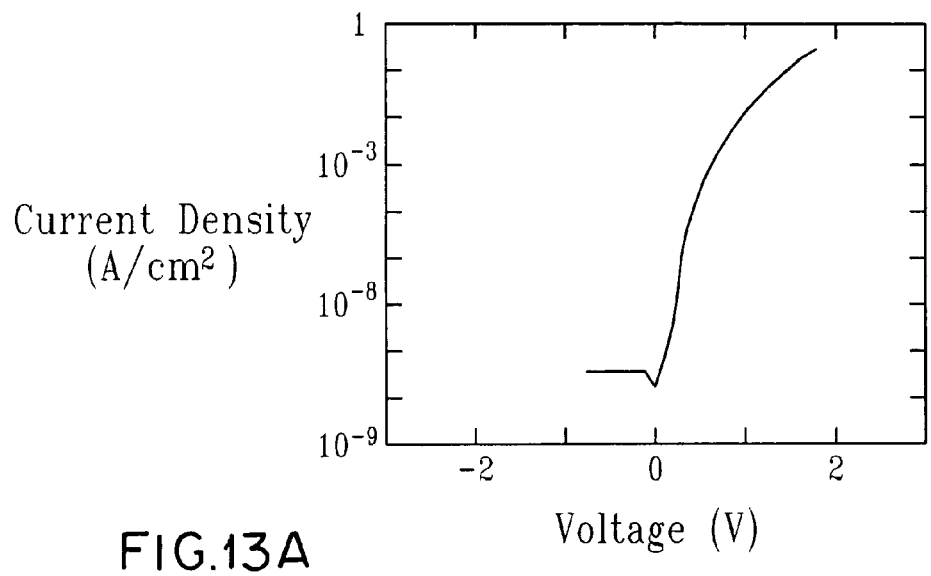
FIGS. 13A–B show the leakage current for H plasma passivated W/HfO$_2$/RTNO capacitors with an equivalent thickness of ~1 nm.
Figure 13B:
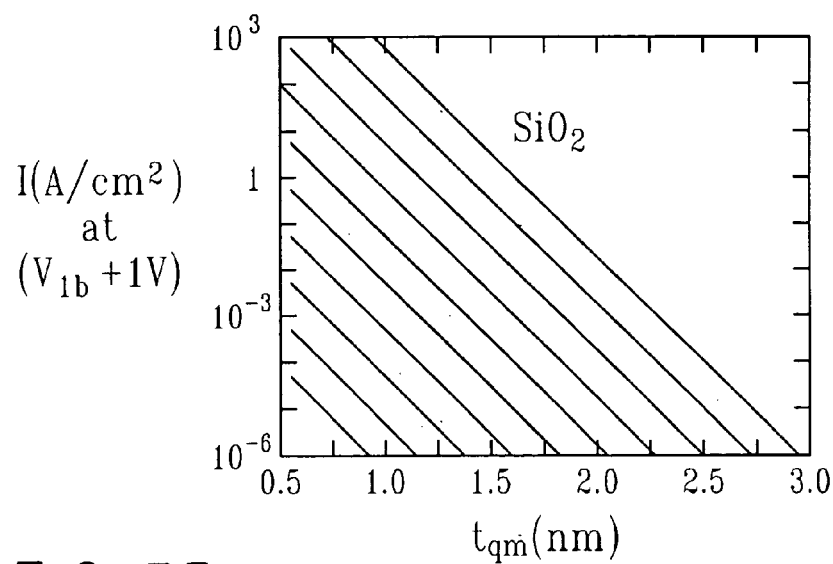

FIG. 13A shows leakage current for a passivated W/HfO$_2$/RTNO capacitors with an equivalent quantum mechanical thickness of ~1 nm as calculated by S. H. Lo, et al., IEEE Electron Device Letters, 18, 209 (1997). Note that the leakage current is four orders of magnitude less than SiO$_2$, See FIG. 13B.

EXAMPLE 6

Fabrication of a Transistor

In this embodiment, the inventive method is used to deposit hafnium or zirconium oxide as the gate dielectric layer 15 of the PFET and NFET as shown in FIG. 1. A Si wafer substrate containing patterned structures is used. Selected regions of the substrate contain shallow trench isolation (STI) oxide located between the sites of transistor, other regions contain the field oxide, and selected regions of bare Si are exposed in the regions where transistor are to be located. The substrate is then placed in a suitable modular cluster tool, the surface of the bare Si is treated to form a SiO$_x$N$_y$ layer in situ without breaking vacuum, before a layer of hafnium oxide is deposited to a thickness of 1–100 nm using the CVD process of this invention. The wafer is then transported to a second module of the modular cluster tool where the gate electrode can be deposited on the hafnium oxide and/or zirconium oxide in situ without breaking vacuum.

EXAMPLE 7

Figure 14:
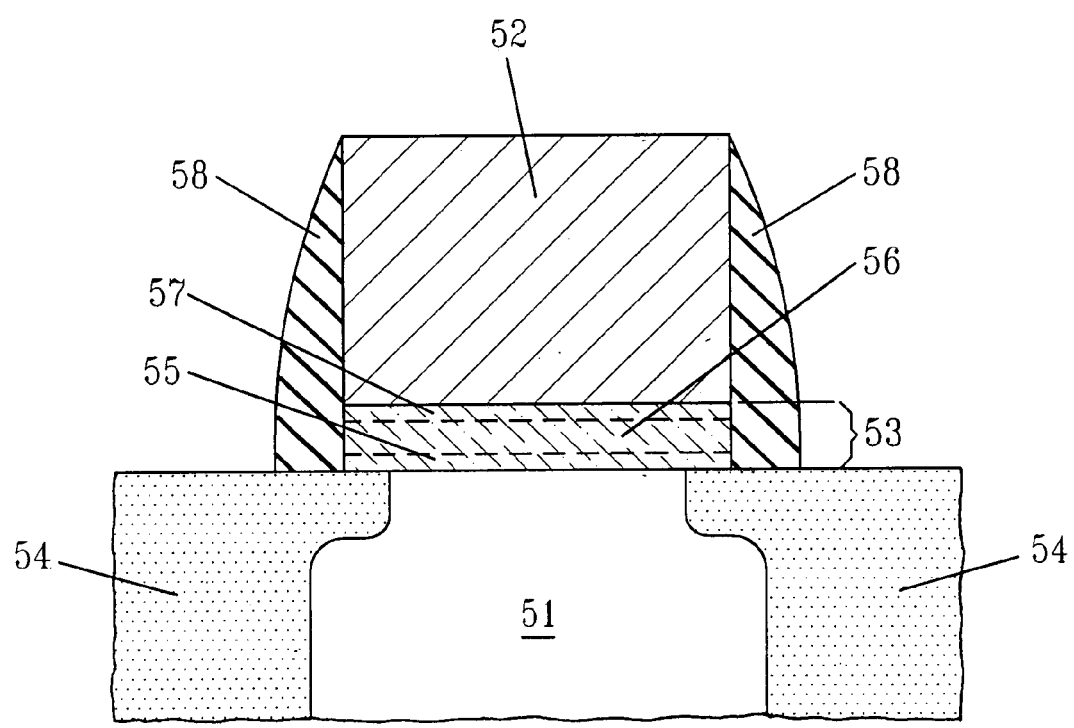
FIG. 14 is an illustration of a cross-sectional view of a transistor of the present invention.

Fabrication of a Transistor Utilizing Hafnium Oxide and/or Zirconium Oxide Deposited by the Inventive Method as a Component of a Multilayer Gate Dielectric In this embodiment the inventive method is used to deposit a multilayer gate dielectric, 53 where at least one of the layers is hafnium oxide and/or zirconium oxide doped or undoped. As shown in FIG. 14, a transistor device is formed on a conductivity region 51 and contains a gate electrode 52 formed on a gate dielectric 53 and a pair of n-type source/drain regions 54 formed on laterally opposite sides of gate electrode 52. The multilayer gate dielectric, 53 is comprised of an optional upper layer, 57 which may act as a dopant diffusion barrier and stabilize the structure during deposition of the gate electrode 52. An optional lower layer, 55 which may act as an electron barrier layer and as a layer to prevent oxidation of the underlying silicon during processing or both. The middle layer, 56 is a high-K dielectric layer. A suitable lower layer 55 is composed of dielectric materials including, but not limited to: SiO$_2$, SiO$_x$N$_y$, Si$_3$N$_4$, prepared from oxidation or nitridation of the silicon substrate or deposited separately. Other suitable lower layer materials include metal oxides or metal silicates. A high-K dielectric layer 56 selected from the group consisting of hafnium oxide and/or zirconium oxide or a multilayer structure where at least one of the layers is hafnium oxide and/or zirconium oxide. The dielectric materials comprising the multilayer structure with hafnium oxide and/or zirconium oxide are selected from the group including, but not limited to: Ta$_2$O$_5$, TiO$_2$, ZrO$_2$, HfO$_2$, Al$_2$O$_3$, La$_2$O$_3$, Y$_2$O$_3$, yttrium alumnate, lathnaum alumnate, lanthanum silicate, yttrium silicate, hafnium silicate, zirconium silicate, doped or undoped mixtures, layers or combinations thereof. The multilayer structure with hafnium oxide and/or zirconium oxide may be comprised of several layers of different materials such as a layer of hafnium oxide and/or zirconium oxide sandwiched between layers of hafnium oxide and/or zirconium oxide. The optional upper layer 57 may be an oxidized or nitrided surface of the middle layer, or a deposited dielectric material including, but not limited to: SiO$_2$, SiO$_x$N$_y$, Si$_3$N$_4$, ZrO$_2$, HfO$_2$, Al$_2$O$_3$, aluminosilicate, ytrrium silicate, zirconium silicate, hafnium silicate, lanthanum silicate doped or undoped mixtures, layers or combinations thereof Preferred gate dielectrics are comprised of a lower layer of SiO$_x$N$_y$, a layer of hafnium oxide and/or zirconium oxide, and an upper barrier layer of nitrided hafnium oxide and/or zirconium oxide. The hafnium oxide and/or zirconium oxide in the gate dielectric 53 is deposited by the inventive method.

Figure 15:
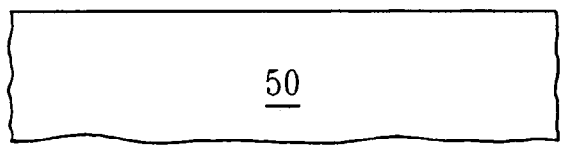
FIGS. 15–22 are illustrations of a cross-sectional view of the fabrication of a transistor.
Figure 16:
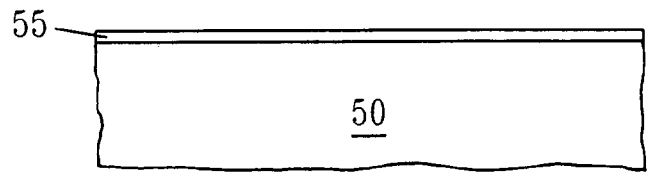
Figure 17:
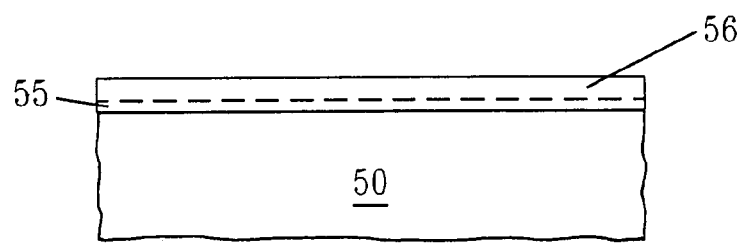
Figure 18:
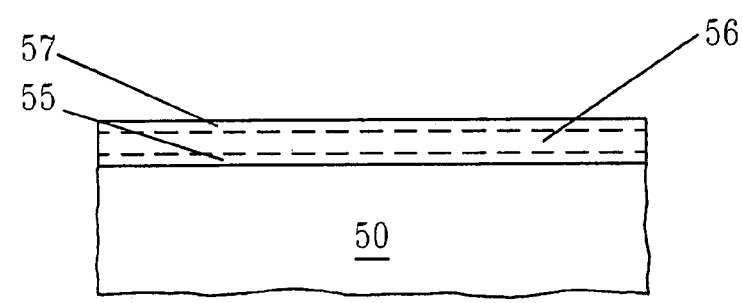
Figure 19:
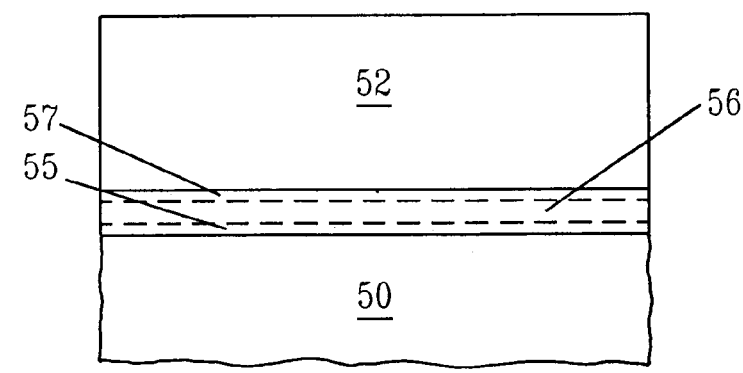
Figure 20:
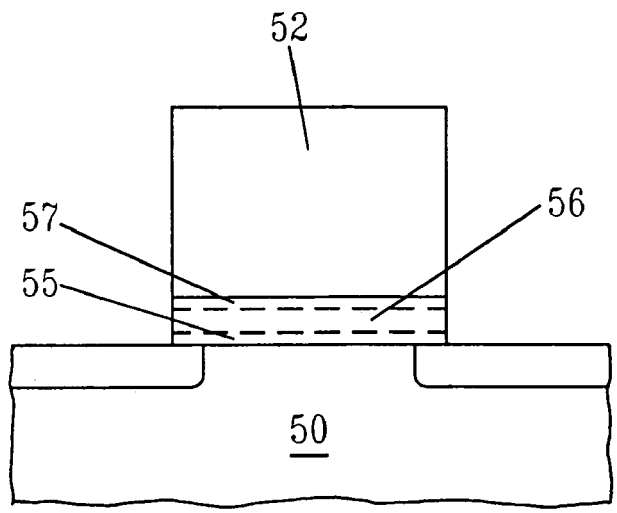
Figure 21:
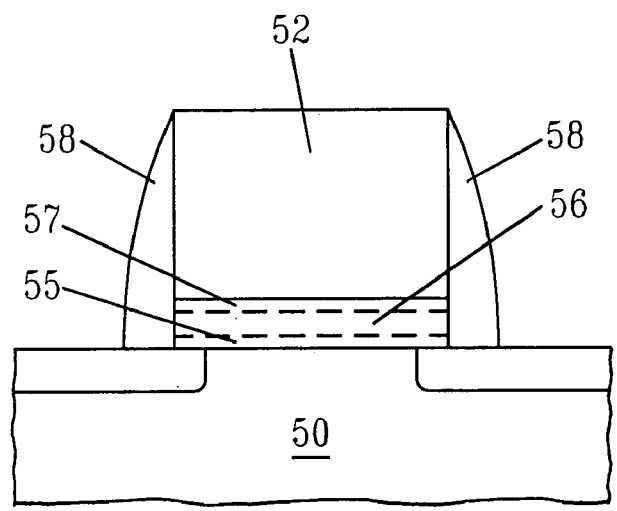
Figure 22:
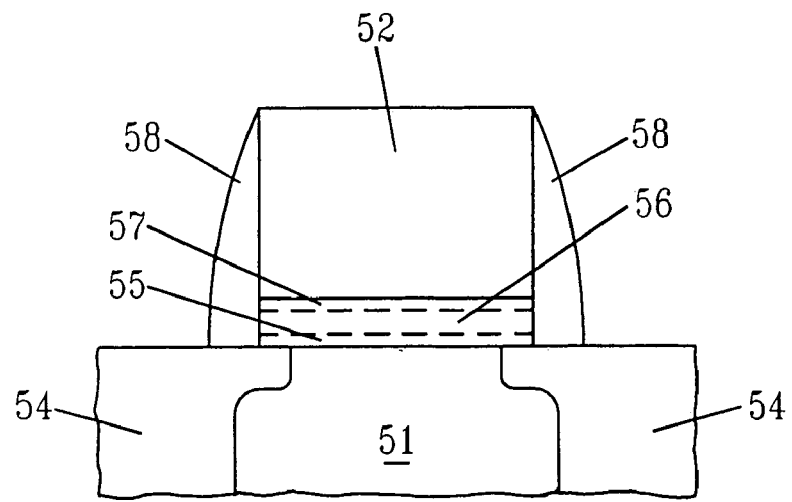

FIGS. 15 through 22 are cross sectional views showing one preferred fabrication of a transistor using the inventive method. Fabrication of the gate dielectric 53 is done in situ in a cluster tool as manufactured by TEL. In FIG. 15 a silicon substrate 50 with a clean (no native SiO$_2$) surface is the starting point. In FIG. 16 the lower layer 55 has been formed by oxidation\nitridation of the silicon substrate 50 to form a SiO$_x$N$_y$ layer. In FIG. 16, a layer 56 of hafnium oxide and/or zirconium oxide has been formed by the inventive method, comprised of depositing hafnium oxide and/or zirconium oxide by chemical vapor deposition at temperatures >400° C. in the presence of an oxidant such as oxygen, ozone, N$_2$O, H$_2$O or mixtures thereof. In FIG. 17, the upper layer 57 is formed by plasma nitridation of the hafnium oxide and/or zirconium oxide surface. In FIG. 18, polysilicon is deposited as the gate electrode 52. In FIGS. 19 through 22, the gates are formed, extension implant done, spacers 58 formed, and source/drain implants performed to produce a fully formed devices. The subsequent steps of contact formation, etc. are not shown.

EXAMPLE 8

Figure 23:
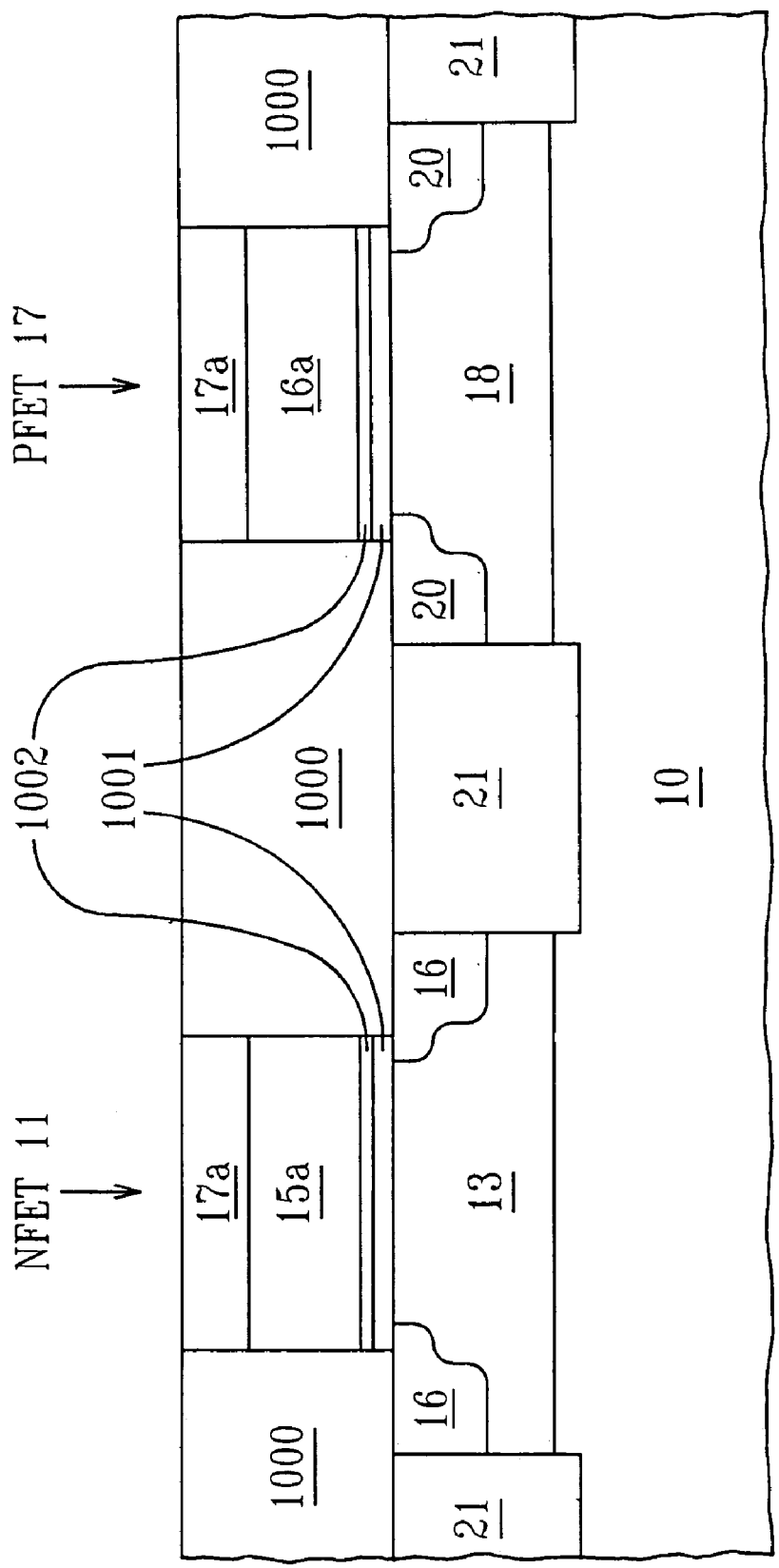
FIG. 23 is an illustration of a cross-sectional view of a transistor of the present invention made using a metal gate self-aligned process.

In this Example, the Process Flow Used to Fabricate a Transistor Using Metal Gates is Described A possible metal gate self-aligned process is outlined below. The resultant structure is shown in FIG. 23. The self-aligned process uses a replacement gate flow. A dielectric layer 1000 was deposited on top of a standard CMOS structure shown in FIG. 1. The structure was then planarized by CMP, the poly Si n+ and p+ layers (14 and 19) and oxides (15) were then removed. Next, the RTNO or UTO 1001 and HfO$_2$ 1002 are deposited in the vias. Metal 15a (NFET) and 16a (PFET) were deposited on top of the HfO$_2$. The via was finally filled with a suitable material 17a, which may be a metal or an insulator. The structure was finally planarized using CMP. FIG. 23 shows the final integrated structure. The reference numerals not specifically mentioned herein are representative of the elements previously described in FIG. 1.

Materials suitable for the NFET gate electrode 16a include, but not limited: to polysilicon, W, Mo, TiN, TaN, TaSiN, Fe, Mn, Nb, V, Ag, Bi, Cd, Fe, Ga, Hf, In, Mn, Y, Zr doped or undoped alloys, mixtures and multilayers, thereof. Materials suitable for the gate electrode 17a for PFET include, but not limited to: polysilicon, Ni, W, Mo, Ti, TiN, Pd, Pt, Au, Ir, Rh, doped or undoped alloys, mixtures and multilayers, thereof.

In this example, the gate dielectric 1002, hafnium oxide and/or zirconium oxide, was deposited by the inventive method as described in examples 1–5.

EXAMPLE 9

Fabrication of a Stack Capacitor

In this embodiment, an integrated circuit capacitor is fabricated incorporating hafnium oxide and/or zirconium oxide deposited by the inventive method. As shown in FIG. 2, a typical capacitor is formed on a substrate 30, connected by a plug 31 to a transistor, with a barrier 32 and consists of a bottom electrode 33, a dielectric material 34, and a top electrode 35. In this embodiment the dielectric material, 34 hafnium oxide and/or zirconium oxide, is deposited by the inventive method.

Figure 24:
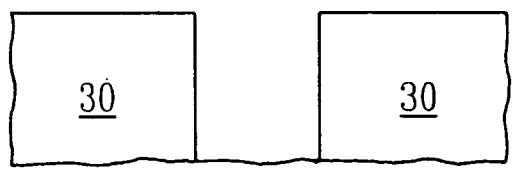
FIGS. 24–28 are illustrations of a cross-sectional view of the fabrication of a stack capacitor.
Figure 25:
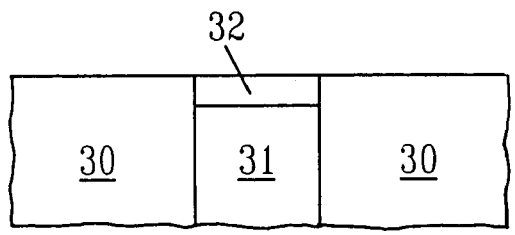
Figure 26:
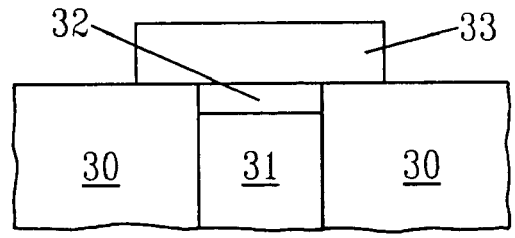
Figure 27:
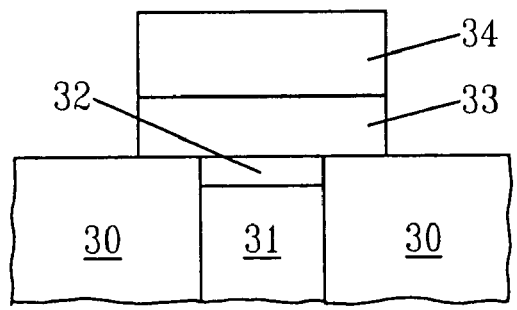
Figure 28:
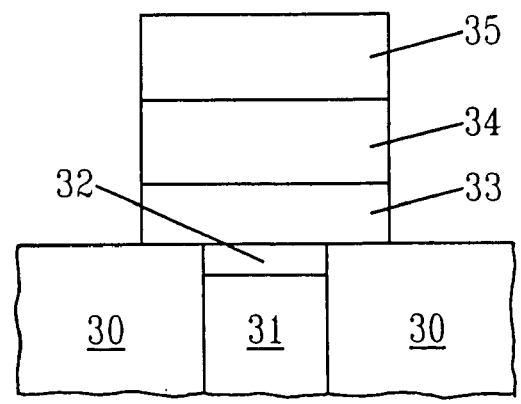

FIGS. 24 through 28 are partial cross sectional views showing one example of a possible fabrication sequence for a capacitor. In FIG. 24 a substrate 30 having a trench is formed. Substrates include, but are not limited to Si-containing semiconductor substrates, silicon on insulator substrates, Ge substrates, SiGe substrates, GaAs substrates, and other like substrates, dielectrics, metals, organic substrates, glasses, metal oxides, plastic polymeric substrates and mixtures, combinations and layers thereof. In FIG. 25 a plug material 31 and an optional barrier 32 is formed. The plug material is composed of conventional conductive materials including, but not limited to: polysilicon, W, Mo, Ti, Cr, Cu, and may deposited utilizing the inventive method. The optional conductive barrier 32 is composed of conventional conductive materials including, but not limited to TaN, TaSiN, TiAlN, TiSiN, TaSiN, TaWN, TiWN, TaSiN, TaAlN, NbN, ZrN, TaTiN, TiSiN, TiAlN, $IrO_2$, SiC, $TiPt_2$, TiNPt, TiAlN-Pt, Ru, $RuO_2$, RuPt, $RuO_2$, WSi, Ti, TiSi, doped and undoped polysilicon, Al, Pd, Ir, $IrO_x$, Os, $OsO_x$, MoSi, TiSi, $ReO_2$, mixtures or multilayers thereof and may be deposited utilizing the inventive method. In FIG. 26 a bottom electrode 33 is formed. The bottom electrode is composed of conductive materials including, but not limited to: polysilicon, Ni, Pd, Pt, Cu, Ag, Au, Ru, Ir, Rh, $IrO_x$, $RuO_x$, TaN, TaSiN, Ta, $SrRuO_3$, $LaSrCoO_3$, doped or undoped alloys, mixtures, or multilayer, thereof. In FIG. 27, a dielectric material 34 is formed. The dielectric material is selected from the group consisting of hafnium oxide and/or zirconium oxide or a multilayer structure where at least one of the layers is hafnium oxide and/or zirconium oxide. The dielectric materials comprising the multilayer structure with hafnium oxide and/or zirconium oxide are selected from any insulating material including, but not limited to: $SiO_2$, $SiO_xN_y$, $Si_3N_4$, metal oxides such as $Ta_2O_5$, $TiO_2$, $ZrO_2$, $HfO_2$, $La_2O_3$, $Y_2O_3$ mixtures or layers thereof, or multicomponent metal oxides such as pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include but are not limited to: barium strontium titanate, zirconate, hafnate, lead titanate, yttrium alumnate, lanthanum alumnate, lead zirconium titanate, silicates such as hafnium silicate, zirconium silicate including rare earth doped silicates. In FIG. 28, a top electrode 35 is formed. The top electrode is composed of conductive materials including, but not limited to: polysilicon, Ni, Pd, Pt, Cu, Ag, Au, Ru, Ir, Rh,$IrO_x$, $RuO_x$, TaN, TaSiN, Ta, $SrRuO_3$, $LaSrCoO_3$, doped or undoped alloys, mixtures, or multilayer, thereof. The top and bottom electrode may or may not be similar. In this embodiment, the dielectric material 34, hafnium oxide and/or zirconium oxide, is deposited by the inventive method.

EXAMPLE 10

Fabrication of a Trench Capacitor

Figure 29:
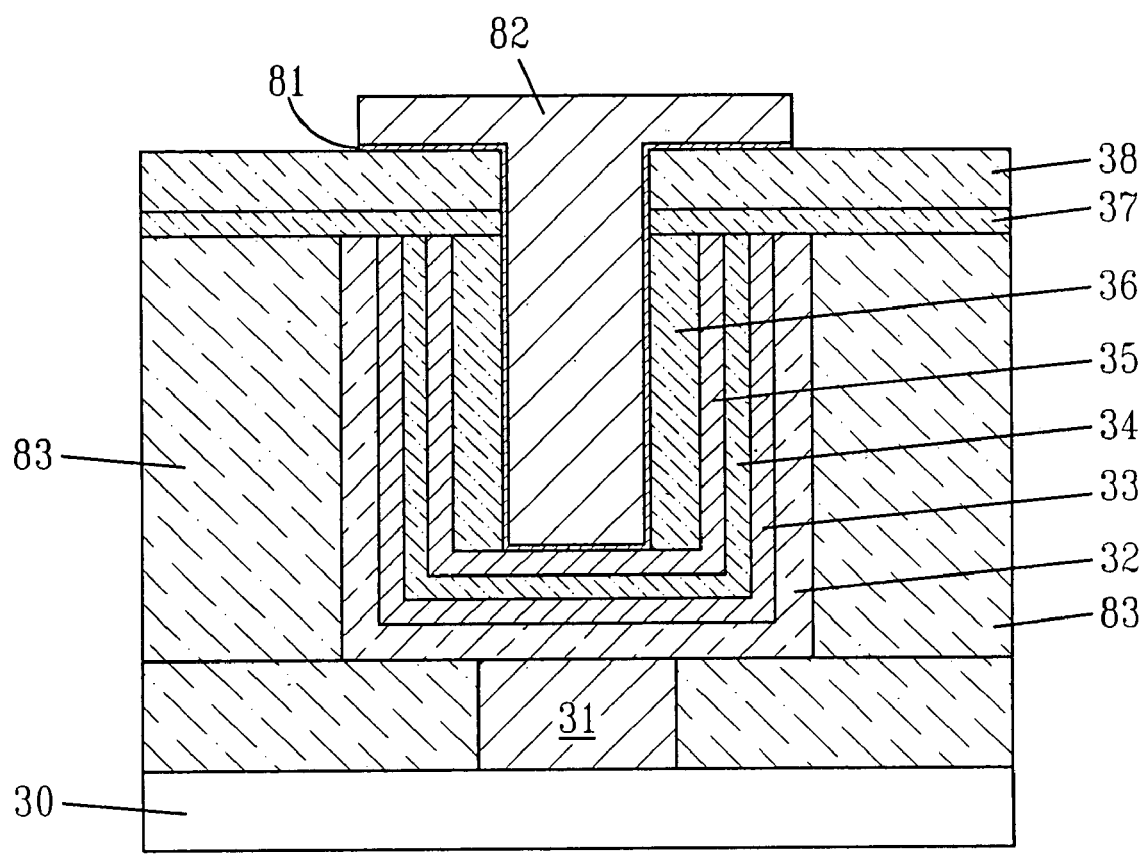
FIG. 29 is an illustration of a cross-sectional view of a trench capacitor.

In this embodiment, an integrated circuit trench capacitor is fabricated incorporating at least one component deposited by the inventive method. One possible example for fabricating a trench capacitor on a substrate 30 is shown in FIG. 29. A capacitor recess is formed in the substrate 30 which is connected to underlying circuitry via plug 31. The circuitry is covered with a dielectric insulating layer (isolation dielectric) 83. Substrates include, but are not limited to Si-containing semiconductor substrates, silicon on insulator substrates, Ge substrates, SiGe substrates, GaAs substrates, and other like substrates, dielectrics, metals, organic substrates, glasses, metal oxides, plastic polymeric substrates and mixtures, combinations and layers thereof.

The dielectric insulating layer (isolation dielectric) 83 is selected from any insulating material including, but not limited to: $SiO_2$, $SiO_xN_y$, $Si_3N_4$, phosphosilicate glass, or metal oxides such as hafnium oxide and/or zirconium oxide doped or undoped mixtures, or multilayer, thereof. Over the plug and the capacitor recess is deposited in sequence, an optional conductive barrier layer 32, bottom electrode layer 33, dielectric layer 34, and a top electrode layer 35, and optional dielectric buffer layer 36. The plug material is composed of conventional conductive materials including, but not limited to: polysilicon, W, Mo, Ti, Cr, Cu, and may deposited utilizing the inventive method. The optional conductive barrier 32 is composed of conventional conductive materials including, but not limited to TaN, TaSiN, TiAlN, TiSiN, TaSiN, TaWN, TiWN, TaSiN, TaAlN, NbN, ZrN, TaTiN, TiSiN, TiAlN, $IrO_2$, SiC, TiPt, TiNPt, TiAlN-Pt, Ru, $RuO_2$, RuPt, $RuO_2$, WSi, Ti, TiSi, doped and undoped polysilicon, Al, Pd, Ir, $IrO_x$, Os, $OsO_x$, MoSi, TiSi, $ReO_2$, mixtures or multilayers thereof and may be deposited utilizing the inventive method. The bottom electrode 33 is composed of conductive materials including, but not limited to: polysilicon, Ni, Pd, Pt, Cu, Ag, Au, Ru, Ir, Rh,$IrO_x$, $RuO_x$, TaN, TaSiN, Ta, $SrRuO_3$, $LaSrCoO_3$, doped or undoped alloys, mixtures, or multilayer, thereof. The dielectric material, 34, is selected from the group consisting of hafnium oxide and/or zirconium oxide or a multilayer structure where at least one of the layers is hafnium oxide and/or zirconium oxide.

The dielectric materials comprising the multilayer structure with hafnium oxide and/or zirconium oxide are selected from any insulating material including, but not limited to: $SiO_2$, $SiO_xN_y$, $Si_3N_4$, metal oxides such as $Ta_2O_5$, $TiO_2$, $ZrO_2$, $HfO_2$, $Al_2O_3$, $La_2O_3$, $Y_2O_3$ alloys, mixtures or layers thereof, or multicomponent metal oxides such as pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include but are not limited to: barium strontium titanate, zirconate, hafnate, lead titanate, yttrium alumnate, lanthanum alumnate, lead zirconium titanate, silicates such as hafnium silicate, zirconium silicate including rare earth doped silicates. The top electrode 35 is composed of conductive materials including, but not limited to: polysilicon, Ni, Pd, Pt, Cu, Ag, Au, Ru, Ir, Rh,$IrO_x$, $RuO_x$, TaN, TaSiN, Ta, SrRuO$_3$, LaSrCoO$_3$, doped or undoped alloys, mixtures, or multilayer, thereof. The top and bottom electrode may or may not be similar. The optional dielectric barrier is composed of any insulating material including, but not limited to SiO$_2$, SiO$_x$N$_y$, Si$_3$N$_4$, TiON, AlN, SiN, TiN, metal oxides such as Ta$_2$O$_5$, TiO$_2$, ZrO$_2$, HfO$_2$, Al$_2$O$_3$, La$_2$O$_3$, Y$_2$O$_3$, alloys, mixtures or layers thereof, or multicomponent metal oxides. The sequentially deposited layers are planarized to yield a trench capacitor in the capacitor recess.

An insulating passivation layer 37 and an inter-layer dielectric layer 38 are deposited to form a barrier structure over the trench capacitor in the capacitor recess. The insulating passivation layer 37 is composed of any insulating material including, but not limited to SiO$_2$, SiO$_x$N$_y$, Si$_3$N$_4$, TiON, AlN, SiN, TiN, metal oxides such as Ta$_2$O$_5$, TiO$_2$, ZrO$_2$, HfO$_2$, Al$_2$O$_3$, oxide, La$_2$O$_3$, Y$_2$O$_3$, alloys, mixtures or layers thereof, or multicomponent metal oxides. The inter-layer dielectric 38 is selected from any insulating material including, but not limited to: SiO$_2$, SiO$_x$N$_y$, Si$_3$N$_4$, phosphosilicate glass, or metal oxides such as hafnium oxide and/or zirconium oxide doped or undoped mixtures, or multilayer, thereof. A via is formed in the barrier structure.

A diffusion barrier layer 81 and a metallazation layer 82 is deposited over the barrier structure and via. The diffusion barrier layer 81 includes, but not limited to: WN, TiN, or TaN. The metallazation layer 82 is selected from any conductive material including, but not limited to: Al, W, Mo, Ti, Cr, or Cu doped or undoped alloys, mixtures, or layers thereof. In this embodiment, the dielectric material 34, hafnium oxide and/or zirconium oxide, is deposited by the inventive method, optionally hafnium oxide and/or zirconium oxide may be utilized as the dielectric including, but not limited to insulating passivation layer, inter-layer dielectric, diffusion barrier layer, isolation dielectric.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    providing a precursor mixture comprising hafnium and/or zirconium alkoxide precursor and a liquid, said liquid is inert such that the liquid does not react substantially with said alkoxide precursor;
    vaporizing at least said hafnium and/or zirconium alkoxide precursor into a vaporized precursor;
    depositing a constituent of the vaporized precursor onto a surface of a substrate to form a hafnium and/or zirconium oxide film at a deposition temperature of greater than 400° C., wherein said hafnium and/or zirconium oxide film comprises little or no FTIR detectable C or OH;
    forming a conductive metal atop said hafnium and/or zirconium oxide film; and
    passivating the hafnium and/or zirconium oxide film by hydrogen plasma treatment or forming gas anneal under conditions wherein the conductive metal reacts with trapped water at an interface between the conductive metal and the hafnium and/or zirconium oxide film interface to form a thin conductive metal oxide interlayer that releases hydrogen.

2. The method of claim 1 wherein said hafnium and/or zirconium alkoxide precursor is dissolved in said liquid.

3. The method of claim 1 wherein said hafnium and/or zirconium alkoxide precursor is emulsified in said liquid.

4. The method of claim 1 wherein said hafnium and/or zirconium alkoxide precursor is suspended in said liquid.

5. The method of claim 1 wherein said precursor mixture contains from about 0.05 to about 0.4 molar, of said hafnium and/or zirconium alkoxide precursor in 100%, by weight, liquid.

6. The method of claim 1 wherein said alkoxide precursor has the formula:

$$M(OR)_4$$

wherein M is Zr or Hf; and
R is a linear or branched C1–22 alkyl or phenyl.

7. The method of claim 6 wherein said alkoxide precursor is hafnium or zirconium isoproxide, hafnium or zirconium sec-butoxide, hafnium or zirconium ethoxide, hafnium or zirconium isobutoxide, hafnium or zirconium methoxide, hafnium or zirconium propoxide, hafnium or zirconium butoxide, hafnium or zirconium tertiary butoxide, or hafnium or zirconium phenoxide.

8. The method of claim 1 wherein said liquid is an aliphatic hydrocarbon, an aromatic hydrocarbon, an alcohol, an ether, an aldehyde, a ketone, an acid, a phenol, an ester, an amine, an alkylamine, a halogenated hydrocarbon, a silylated hydrocarbon, a thioether, a cyanate, an isocyanate, a thiocyanate, a silicone oil, a nitroalkyl, an alkylnitrate or any mixture thereof.

9. The method of claim 1 wherein said vaporized precursor includes vaporized liquid.

10. The method of claim 1 wherein said depositing is performed in the presence of a reactant gas selected from oxygen, N$_2$O, NO, H$_2$O and ozone.

11. The method of claim 10 wherein said reactant gas is oxygen.

12. The method of claim 1 wherein said vaporizing is performed at a temperature of from about 25° C. to about 250° C.

13. The method of claim 1 wherein depositing is performed at a temperature of from about 450° C. to about 100° C.

14. The method of claim 1 wherein said liquid is removed during said vaporizing step.

* * * * *

UNITED STATES PATENT AND TRADEMARK OFFICE
CERTIFICATE OF CORRECTION

PATENT NO. : 6,982,230 B2
DATED : January 3, 2006
INVENTOR(S) : Cyril Cabral, Jr. et al.

It is certified that error appears in the above-identified patent and that said Letters Patent is hereby corrected as shown below:

<u>Column 12,</u>
Line 23, "oxidationlnitridation" should read -- oxidation/nitridation --.

<u>Column 16,</u>
Line 53, "100° C" should read -- 1000° C --.

Signed and Sealed this

Twenty-fifth Day of April, 2006

JON W. DUDAS
*Director of the United States Patent and Trademark Office*